United States Patent
Haga et al.

(10) Patent No.: US 10,330,766 B2
(45) Date of Patent: Jun. 25, 2019

(54) ELECTRONIC DEVICE, ELECTROSTATIC CAPACITANCE SENSOR AND TOUCH PANEL

(75) Inventors: Hiroshi Haga, Kanagawa (JP); Hideki Asada, Kanagawa (JP)

(73) Assignee: NLT TECHNOLOGIES, LTD., Kawasaki, Kanagawa (JP)

( * ) Notice: Subject to any disclaimer, the term of this patent is extended or adjusted under 35 U.S.C. 154(b) by 226 days.

(21) Appl. No.: 14/240,675

(22) PCT Filed: Aug. 30, 2011

(86) PCT No.: PCT/JP2011/069673
§ 371 (c)(1),
(2), (4) Date: Oct. 24, 2014

(87) PCT Pub. No.: WO2013/030966
PCT Pub. Date: Mar. 7, 2013

(65) Prior Publication Data
US 2015/0042357 A1 Feb. 12, 2015

(51) Int. Cl.
*G01R 35/00* (2006.01)
*G06F 3/044* (2006.01)
*G06F 3/041* (2006.01)

(52) U.S. Cl.
CPC ............. *G01R 35/00* (2013.01); *G06F 3/044* (2013.01); *G06F 3/0418* (2013.01)

(58) Field of Classification Search
CPC ........ G06F 3/0418; G06F 3/044; G01R 35/00
(Continued)

(56) References Cited

U.S. PATENT DOCUMENTS 5,691,512 A * 11/1997 Obi .................. G06F 3/046
178/18.04
8,564,565 B2 * 10/2013 Westhues .............. G06F 3/0412
178/18.01
(Continued)

FOREIGN PATENT DOCUMENTS

EP 0691764 A2 * 1/1996 ............. H03D 3/007
EP 2908437 A1 8/2015
(Continued)

OTHER PUBLICATIONS

International Search Report of PCT/JP2011/069673 dated Dec. 6, 2011.
(Continued)

*Primary Examiner* — Son T Le
*Assistant Examiner* — Akm Zakaria
(74) *Attorney, Agent, or Firm* — Sughrue Mion, PLLC

(57) ABSTRACT

When the excitation frequency of a touch panel and the frequency of external noise match or are close, noise cannot be removed by a bandpass filter. In addition, when a touch detection operating period is limited to a short period such as the no addressing period, the signal-to-noise ratio (S/N) decreases because frequency separation decreases and the noise removal effect by averaging is degraded. An electronic device of the present invention includes a sensor system (101), an excitation generator (102) that generates an intermittent sinusoidal signal and applies this signal to the sensor system, and a demodulator (105) that demodulates the amplitude modulated signal that is the output of the sensor system. The demodulator uses both the response x1(t) of the sensor system in the period in which the excitation generator outputs the sinusoidal signal, and the response z1(t) of the sensor system in the period in which the excitation generator does not output the sinusoidal signal at least either imme-
(Continued)

diately before or immediately after the signal output to generate the demodulated signal D(t).

6 Claims, 14 Drawing Sheets

(58) Field of Classification Search
USPC .......................................... 324/601; 345/173
See application file for complete search history.

(56) References Cited

U.S. PATENT DOCUMENTS

| | | | |
|---|---|---|---|
| 2004/0217945 | A1 | 11/2004 | Miyamoto et al. |
| 2007/0257890 | A1 | 11/2007 | Hotelling et al. |
| 2007/0262966 | A1* | 11/2007 | Nishimura ............... G06F 3/044 |
| | | | 345/173 |
| 2008/0158167 | A1 | 7/2008 | Hotelling et al. |
| 2009/0040192 | A1 | 2/2009 | Haga |
| 2010/0013791 | A1 | 1/2010 | Haga et al. |
| 2010/0150218 | A1* | 6/2010 | Yaginuma ........ G01R 31/31709 |
| | | | 375/226 |
| 2011/0134076 | A1 | 6/2011 | Kida et al. |
| 2011/0193571 | A1 | 8/2011 | Lin et al. |
| 2012/0059498 | A1* | 3/2012 | Berchin ................ G06K 9/0055 |
| | | | 700/94 |
| 2012/0162134 | A1 | 6/2012 | Chen et al. |
| 2013/0314109 | A1* | 11/2013 | Kremin ............... G01R 27/2605 |
| | | | 324/686 |

FOREIGN PATENT DOCUMENTS

| | | |
|---|---|---|
| JP | 1-280823 A | 11/1989 |
| JP | 2005301974 A | 10/2005 |
| JP | 2006-106853 A | 4/2006 |
| JP | 2007-334606 A | 12/2007 |
| JP | 2010-086285 A | 4/2010 |
| JP | 2011-013757 A | 1/2011 |
| JP | 2011-014109 A | 1/2011 |
| JP | 2011-154734 A | 8/2011 |
| JP | 5252454 B2 | 7/2013 |
| JP | 5372630 B2 | 12/2013 |
| TW | 201011620 A | 3/2010 |
| WO | 2011035485 A1 | 3/2011 |

OTHER PUBLICATIONS

Communication dated May 6, 2015 from the European Patent Office in counterpart European Application No. 11871843.6.
Communication dated May 11, 2016, from the European Patent Office in counterpart European Application No. 11871843.6.
Communication dated Sep. 5, 2017 from the Japanese Patent Office in counterpart application No. 2016-198410.

* cited by examiner $$M = \frac{1}{T}\int_0^T \left(A_S - \frac{A_S - A_E}{T}t\right)\cos\left(\theta_S - \frac{\theta_S - \theta_E}{T}t\right)dt$$
$$+ j\left\{\frac{1}{T}\int_0^T \left(A_S - \frac{A_S - A_E}{T}t\right)\sin\left(\theta_S - \frac{\theta_S - \theta_E}{T}t\right)dt\right\}$$

ELECTRONIC DEVICE, ELECTROSTATIC CAPACITANCE SENSOR AND TOUCH PANEL

CROSS REFERENCE TO RELATED APPLICATIONS

This is a National Stage of International Application No. PCT/JP2011/069673 filed Aug. 30, 2011, the contents of which are incorporated herein by reference in their entirety.

FIELD OF THE INVENTION

The present invention relates to an electronic device, a electrostatic capacitance sensor and a touch panel and, in particular, to an electronic device, a electrostatic capacitance sensor and a touch panel that use an amplitude modulation and demodulation system.

BACKGROUND ART

A touch panel is a device that detects the coordinates of a position pointed to by a pointing object such as a finger or a pen, or detects a pointing action by such a pointing object. Today, touch panels are typically used in combination with a display such as a Liquid Crystal Display (LCD), a Plasma Display Panel (PDP), or an organic EL display.

Outputs from a touch panel are input into a computer, which controls images displayed on the display and controls a device, thereby implementing an easy-to-use human interface. Touch panels are now used in a wide range of every-day-life applications such as video game machines, portable information terminals, ticket-vending machines, automatic teller machines (ATMs), and automobile navigation systems. As computers grow more powerful and network connection environments become widespread, a wider variety of services are provided through electronic devices and the need for displays with a touch panel is increasing.

One type of touch panel is a surface capacitive touch panel. The surface capacitive touch panel includes (i) a resistive sheet and (ii) drive and sensing circuitry which is connected to the resistive sheet, applies an AC voltage (sinusoidal voltage) to the resistive sheet as an excitation, measures a current flowing through the resistive sheet, and outputs the measurement.

Specifically, the surface capacitive touch panel includes a transparent substrate, a transparent resistive sheet formed on the surface of the transparent substrate, and a thin insulating film formed on the top surface of the resistive sheet. The resistive sheet is referred to as the position sensing conductive film. To drive the touch panel of this type, an AC voltage is applied to the four corners of the position sensing conductive film. When the touch panel is touched with a human finger, a pointing stick or the like (hereinafter referred to as the finger or the like), a capacitor is formed by capacitive coupling between the position sensing conductive film and the finger or the like. A small current flows to the finger or the like via the capacitor. The current flows from the corners of the position sensing conductive film to the point touched with the finger or the like. A signal processing circuit calculates whether or not there is a touch with a finger or the like and, the coordinate of the position touched with the finger or the like on the basis of the current detected by the drive and sensing circuitry. Specifically, the signal processing circuit detects the presence or absence of a touch on the basis of the sum of currents from the four corners of the position sensing conductive film. In addition, the coordinates of the touch position is calculated on the basis of the ratio of the currents from the four corners of the position sensing conductive film.

Touch panels based on the surface capacitive operation principle described above are disclosed in Patent Literatures 1 to 5.

A device in Patent Literature 1, which includes a display panel and a touch panel combined and operated together, is equipped with counter-electrode driving means for applying an AC voltage to the touch panel during a non-display period of the display panel and applying the same AC voltage to the counter electrodes of the display panel in order to prevent decrease in the precision of position detection due to a drive signal for the display panel.

Patent Literature 2 discloses a "touch panel device in which when noise is large, the level of AC voltage oscillation is increased whereas when noise is small, the AC voltage oscillation level is decreased and, when there is noise with a specific frequency, switching is made to a different voltage oscillation frequency, thereby ensuring safety to achieve an improved signal-to-noise ratio, high noise robustness, and electrical safety".

Patent Literature 3 states that "a phase and an AC voltage when a finger has touched the panel are set as a contact vector signal and a scalar quantity calculated from the phase difference between the two signals and amplitudes by using the cosine theorem is set as an AC signal of the actual finger touch, thereby excluding the AC voltage due to a parasitic signal when a finger is not near the resistive sheet or the phase difference between the signals due to a finger of a capacitive grounding human body or a resistive grounding human body from the detection of the touch position".

Patent Literature 4 discloses that "the operational circuit takes an input of an output from the long sensor line LSLi and an output from the short sensor line SSLi and performs a computation using the difference (Delta) between the outputs and the line capacitance ratio Kc to obtain a signal component S".

Patent Literature 5 discloses that "the four nodes are labeled with symbols Na, Nb, Nc and Nd. Terminals of current sensing circuits, which will be described later, are connected to the nodes" and states that "single-pole double-throw switches $21a$ to $21d$ are connected to the nodes Na to Nd through current sensing circuits $13a$ to $13d$. An AC voltage source 22 is connected to one of the two contacts of each of the single-pole double-throw switches $21a$ to $21d$ and a storage capacitance line drive circuit is connected to the other contact (i.e. a node labeled with COM in FIG. 4). The waveform of an AC voltage may be a sinusoidal wave, for example".

PRIOR ART LITERATURE

Patent Literature

Patent Literature 1: Japanese Laid-open Patent Publication No. 2007-334606
Patent Literature 2: Japanese Laid-open Patent Publication No. 2006-106853
Patent Literature 3: Japanese Laid-open Patent Publication No. 2010-86285
Patent Literature 4: Japanese Laid-open Patent Publication No. 2011-13757
Patent Literature 5: Japanese Laid-open Patent Publication No. 2011-14109

SUMMARY OF THE INVENTION

Problems to be Solved by the Invention

The following analysis has been made by the present inventors. The touch panel described in Patent Literature 1 has the following five problems.

A first problem is that the touch panel is sensitive to external noise (electric field variations and capacitive coupling noise). While Patent Literature 1 states that decrease in the precision of position detection due to the drive signal for the display panel is prevented, the touch panel is susceptible to external noise from sources other than the drive signal for the display panel, for example noise emitted from a fluorescent lamp including an inverter circuit that is located above the touch surface of the touch panel.

One reason for the problem is based on the operating principle of the touch panel. Since a surface capacitive touch panel detects the capacitance of a capacitor formed between the position sensing conductive film and a finger, a shied electrode for shielding an electric field may not be formed between the position sensing conductive film and a finger. Therefore, the touch surface of the position sensing conductive film inevitably has a structure that is vulnerable to external noise. The larger the size of the touch panel, the more susceptible to external noise the touch panel is.

Another reason is that the number of noise sources is increasing. For example, inverter fluorescent lamps developed for reducing flickering are accepted in the marketplace and are increasing in number. In addition, more and more switching-mode power supplies, developed in order to increase the efficiency of supply voltage conversion, are being used in rechargers and AC adapters for portable devices. Noise generated from these devices prevents normal operation of capacitance sensing devices.

A second problem is that a bandpass filter may not remove noise when the excitation frequency of the touch panel is equal or close to the frequency of the noise.

The fundamental frequency of noise illustrated above or the frequency of harmonic of noise is equal or close to the excitation frequency of the touch panel. A synchronous detector described in Patent Literature 1 is claimed to perform filtering in order to filter out noise with frequencies different from the excitation frequency. Accordingly, the method that decomposes an observed signal by frequency to select a frequency in this way may not remove noise that has the frequency equal to the excitation frequency.

When the frequency of noise is close to the excitation frequency, noise passes through an attenuation band (or a transition band) between the passband and the stopband of the bandpass filter hence the output of the bandpass filter contains noise. In other words, a practicable bandpass filter has certain frequency resolution limits and therefore may not remove noise with frequencies that are close to the excitation frequency.

A third problem is that if a touch sensing operation time period is restricted by a non-display period (non-addressing period) or the like, frequency resolution decreases so that noise close to the frequency of a true signal may not be removed. For example, when a signal of interest includes two sinusoidal wave signals having the same amplitude, a periodogram spectral estimation method can resolve such spectral peaks that satisfy $$\Delta f \geq \frac{1}{T} \quad \text{[Formula 1]}$$

where T is a signal acquisition time period.

In the method, when the signal acquisition time period T is 500 microseconds, $\Delta f$ is 2 kHz, and therefore, when assuming a true signal of 100 kHz and noise of 99 kHz, both may not be able to be resolved by frequency.

A fourth problem is that the effect of noise removal by averaging decreases and the signal-to-noise ratio decreases. For example, when an observed signal on which Poisson distribution noise is superimposed is acquired many times and averaged to cancel out noise, thereby reducing the noise, the amount of noise reduction is proportional to the square root of the number of the times the observed signal has been acquired. In other words, when the signal acquisition time period is limited to a short time period such as non-display period (non-addressing period), the effect of the noise removal by averaging decreases and the signal-to-noise ratio decreases.

A fifth problem is that if a structure in which a polarizer is placed between a position sensing conductive film and a finger is used as illustrated in Japanese Patent Application No. 2009-163401 by the present applicant, capacitance formed between the position sensing conductive film and the finger is reduced and the signal-to-noise ratio may decrease. Similarly, if a protective glass or the like is inserted between the position sensing conductive film and a finger, the signal-to-noise ratio may decrease.

Therefore, there is the problem of providing an electronic device, a electrostatic capacitance sensor, and a touch panel that are capable of removing noise with a frequency equal to the frequency of a signal or close to the frequency of a signal that the noise may not be resolved with conventional frequency resolutions and are therefore capable of precisely detecting the presence or absence of a touch and a touch position.

Means for Solving the Problem

To solve the problems, an electronic device 120 according to the present invention includes a sensor system 101, an excitation generating unit 102 generating an intermittent sinusoidal wave signal and providing the intermittent sinusoidal wave signal to the sensor system, and a demodulating unit 105 demodulating an amplitude-modulated signal output from the sensor system, wherein the demodulating unit generates a demodulated signal D(t) by using both of a response $x_1(t)$ of the sensor system in a period in which the excitation generating unit has output a sinusoidal wave and a response $z_1(t)$ of the sensor system in a period in which there is no sinusoidal wave output from the excitation generating unit, the period in which there is no sinusoidal wave output from the excitation generating unit being at least one of immediately before and immediately after the period in which the excitation generating unit has output the sinusoidal wave.

An electronic device of the present invention further includes a demodulating unit wherein the demodulated signal is a constant multiple of |X-N|, where X is a vector obtained from an amplitude and a phase of a frequency component of the sinusoidal wave, the amplitude and the phase being calculated from a response of the sensor system in a period in which the excitation generating unit has output the sinusoidal wave, and N is a vector obtained from an amplitude and a phase of a frequency component of the sinusoidal wave, the amplitude and the phase being calculated from a response of the sensor system in a period in which there is no sinusoidal wave output from the excitation generating unit.

The electronic device of the present invention further includes a demodulating unit wherein the demodulated signal is a constant multiple of |X-M|, where M is a mean vector of Y and Z, X is a vector obtained from an amplitude and a phase of a frequency component of the sinusoidal wave, the amplitude and the phase being calculated from a response of the sensor system in a period in which the excitation generating unit has output the sinusoidal wave, Y and Z are vectors each obtained from an amplitude and a phase of a frequency component of the sinusoidal wave, the amplitude and the phase being calculated from a response of the sensor system in a corresponding preceding or succeeding period in which there is no sinusoidal wave output from the excitation generating unit immediately before or after the period in which the excitation generating unit has output the sinusoidal wave.

To solve the problems, a electrostatic capacitance sensor according to the present invention, on the other hand, is configured with the electronic device and includes a resistive sheet and a sensor system connected to the resistive sheet, the sensor system including drive and sensing circuitry applying a voltage to the resistive sheet and measuring and outputting a current flowing through the resistive sheet, wherein capacitance of a capacitor formed by the resistive sheet and a pointing object is detected to detect a touch of the pointing object or coordinates of a touch of the pointing object.

The electrostatic capacitance sensor of the present invention is configured with an electronic device and further configured with a display, wherein in a non-addressing period of the display, there are a period in which the excitation generating unit outputs a sinusoidal wave and a period in which the excitation generating unit outputs no sinusoidal wave, and a demodulated signal is generated by using both of a response of the sensor system in a period in which the sinusoidal wave has been output and a response of the sensor system in a period in which no sinusoidal wave is output.

To solve the problems, a touch panel according to the present invention, on the other hand, is configured with the electronic device and includes a resistive sheet and a sensor system connected to the resistive sheet, the sensor system including drive and sensing circuitry applying a voltage to the resistive sheet and measuring and outputting a current flowing through the resistive sheet, wherein capacitance of a capacitor formed by the resistive sheet and a pointing object is detected to detect a touch of the pointing object or coordinates of a touch of the pointing object.

The touch panel of the present invention is configured with the electronic device and further configured with a display, wherein in a non-addressing period of the display, there are a period in which the excitation generating unit outputs a sinusoidal wave and a period in which the excitation generating unit outputs no sinusoidal wave, and a demodulated signal is generated by using both of a response of the sensor system in a period in which the sinusoidal wave has been output and a response of the sensor system in a period in which no sinusoidal wave is output.

To solve the problems, an electronic device according to the present invention includes an operational amplifier, a resistor connected between an output terminal and an inverting input terminal of the operational amplifier, a conductor connected to the inverting input terminal of the operational amplifier, and an excitation generating unit generating an intermittent sinusoidal wave signal and providing the intermittent sinusoidal wave signal to a non-inverting input terminal of the operational amplifier, the electronic device detecting capacitance of the conductor and including a demodulating unit demodulating an amplitude-modulated signal output from the operational amplifier, wherein the demodulating unit generates a demodulated signal by using both of a response of the electronic device in a period in which the excitation generating unit has output a sinusoidal wave and a response of the electronic device in a period in which there is no sinusoidal wave output from the excitation generating unit, the period in which there is no sinusoidal wave output from the excitation generating unit being at least one of immediately before and immediately after the period in which the excitation generating unit has output the sinusoidal wave.

The term electrostatic capacitance sensor as used herein includes a touch sensor.

It should be noted that while it is stated herein and the claims that the excitation generating unit outputs a sinusoidal wave, the output is not limited to a sinusoidal wave with a single frequency. All signals can be represented as a series of sinusoidal waves with different frequencies (Fourier series expansion). In other words, when an excitation generating unit outputs a square wave, for example, the square wave is a series of sinusoidal waves with different frequencies. In this case, signal processing is performed by focusing attention on the fundamental frequency of the square wave to obtain a demodulated signal. Accordingly, an implementation where the excitation generating unit outputs a square wave falls within the scope of the present invention. For a similar reason, an implementation where the excitation generating unit outputs whatever alternating current falls within the scope of the present invention.

Effects of the Invention

By implementing an electronic device, a electrostatic capacitance sensor, a touch sensor and a touch panel according to the present invention, the following five effects can be obtained.

A first effect is that since noise is acquired by stopping a sinusoidal wave, the noise can be accurately acquired regardless of the presence or absence of a finger (presence or absence of a touch).

A second effect is that since the signal processing path for "noise" acquired by stopping a sinusoidal wave is the same as the signal processing path for "true signal plus noise" acquired by providing the sinusoidal wave, the noise can be accurately acquired.

A third effect is that since a subtraction is performed between vectors of "true signal plus noise" and "noise", the true signal can be accurately obtained even when the true signal and the noise have the same frequency.

A fourth effect is that noise with frequencies close to the frequency of a true signal can be removed beyond frequency resolution by using the mean vector of preceding noise (noise acquired during a stop of a sinusoidal wave before the excitation generating unit outputs the sinusoidal wave) and succeeding noise (noise acquired during a stop of the sinusoidal wave after the excitation generating unit has output the sinusoidal wave).

A fifth effect is that by using the mean vector of preceding noise and succeeding noise, noise can be precisely removed even when the amplitude of the noise has changed.

Owing to the five effects described above, the present invention enables provision of a touch panel and an electronic device that are robust to external noise and have a high signal-to-noise ratio.

MODES FOR CARRYING OUT THE INVENTION

First Embodiment

A electrostatic capacitance sensor of the present invention will be illustrated. The function of a typical electrostatic capacitance sensor is implemented by omitting the function of detecting a position from the functions of a touch panel illustrated in the background art section. Since the position detection function is omitted, a conductive sheet or simply a conductor may be used in place of the resistive sheet.

(Configuration)

Figure 1:
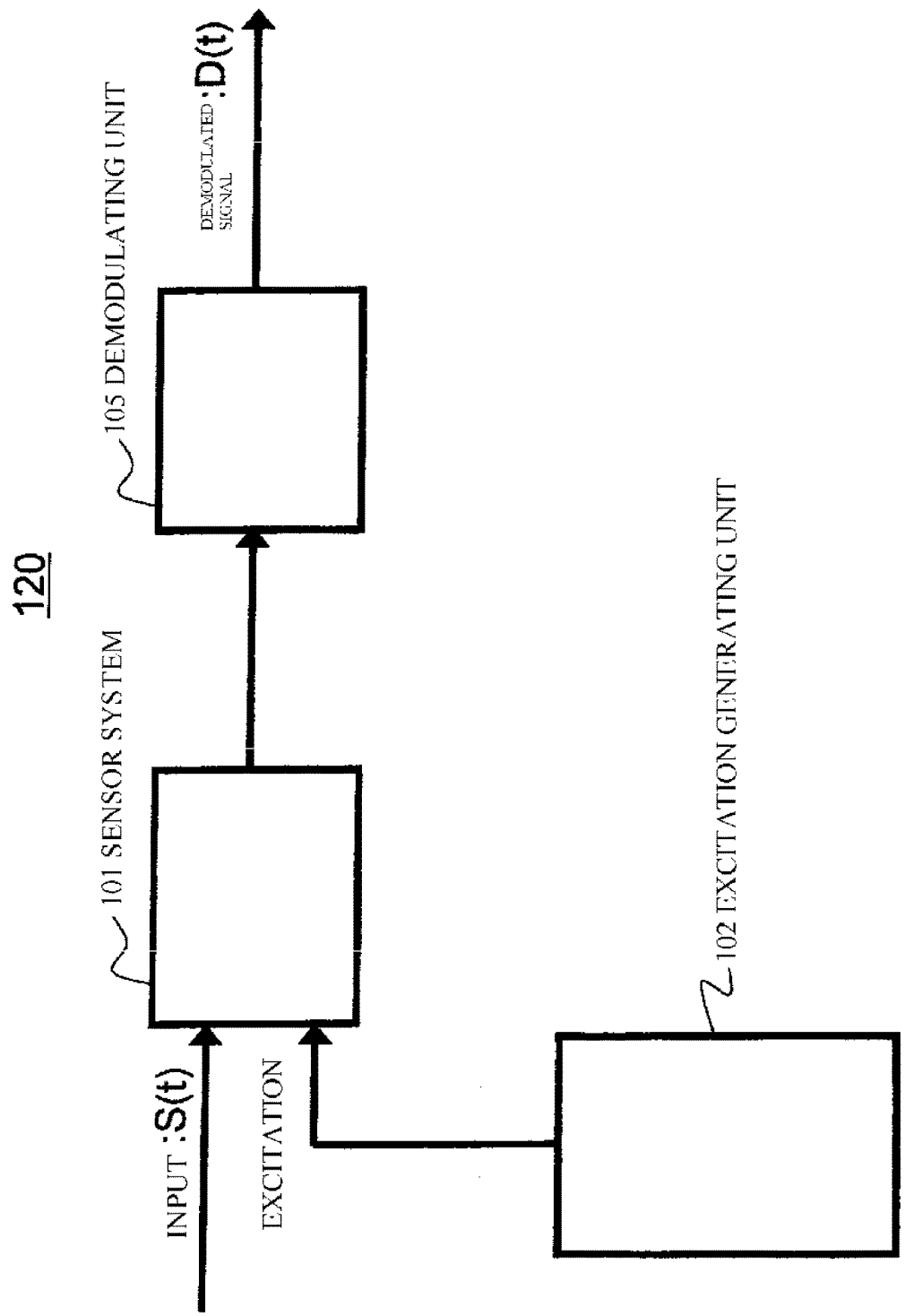
FIG. 1 is a block diagram of an electronic device of the present invention.
Figure 2:
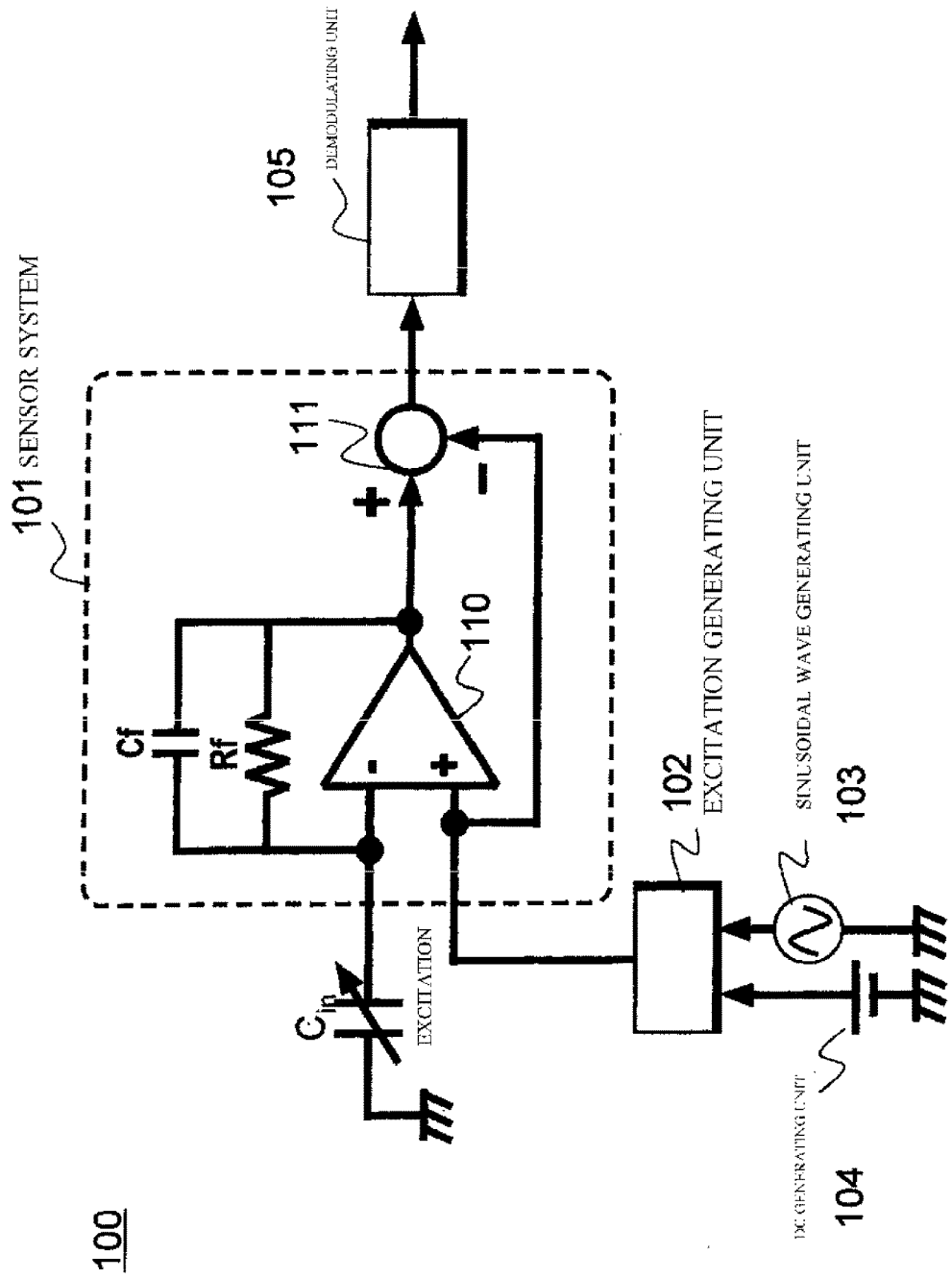
FIG. 2 is a block diagram of a electrostatic capacitance sensor of the present invention.

FIG. 2 is a block diagram of a electrostatic capacitance sensor 100 of the present invention and FIG. 1 is a block diagram of an electronic device 120 of the present invention which is an abstraction of the electrostatic capacitance sensor of the present invention. The electrostatic capacitance sensor 100 illustrated in FIG. 2 is configured to detect the capacitance of a capacitor $C_{in}$ depicted in the figure. The electrostatic capacitance sensor includes a sensor system 101 that takes inputs of the capacitance of the capacitor $C_{in}$ and an excitation and outputs a signal according to the capacitance of the capacitor $C_{in}$, an excitation generating unit 102 generating the excitation, a sinusoidal wave generating unit 103 connected to the excitation generating unit, and a DC generating unit 104. The output from the sensor system is input into a demodulating unit 105, which generates a demodulated signal.

The excitation generating unit generates an intermittent sinusoidal wave signal. Means for generating an intermittent sinusoidal wave signal includes the sinusoidal wave generating unit 103 and the DC generating unit 104 provided as illustrated in FIG. 2, and means for switching therebetween is provided. However, it is not limited to such means. Other means may be, for example, to use a digital-to-analog converter and provide a digital signal obtained by discretizing an intermittent sinusoidal wave to the DA converter.

The sensor system includes an operational amplifier 110, a resistance $R_f$ inserted in its feedback path, and a capacitor $C_f$ and further includes an adder 111 that performs a subtraction between an output voltage from the operational amplifier 110 and an excitation voltage.

Assuming that the operational amplifier 110 is an ideal operational amplifier and letting $V_1$ denote the voltage of excitation input into the sensor system 101 and $V_2$ denote the output voltage from the sensor system, then the frequency response $H(j\omega)$ of the sensor system can be obtained by solving a circuit equation obtained from the figure as follows:

$$H(j\omega) = \frac{V_2}{V_1} = \frac{j\omega C_{in} R_f}{1 + j\omega C_f R_f} \qquad \text{[Formula 2]}$$

Here, $\omega$ represents the angular frequency of the excitation and j represents an imaginary unit. From the equation, the amplitude response $|H(j\omega)|$ of the sensor system is $$|H(j\omega)| = \frac{\omega C_{in} R_f}{\sqrt{1 + \omega^2 C_f^2 R_f^2}}$$

As represented by formula 3, the amplitude of the output from the sensor system 101 is proportional to the capacitance of the capacitor $C_{in}$.

Since the frequency of the output from the sensor system is equal to the frequency of the excitation and the amplitude of the output changes in accordance with the capacitance of the capacitor $C_{in}$, the sensor system can be said to be an amplitude modulation system.

FIG. 2 can be abstracted to FIG. 1. The input S(t) into the sensor system can be a capacitance as illustrated in this embodiment as well as an electrical signal such as a voltage or a current.

(Operation)

An operation of the electrostatic capacitance sensor of the present invention will be illustrated with reference to FIG. 3.

Figure 3:
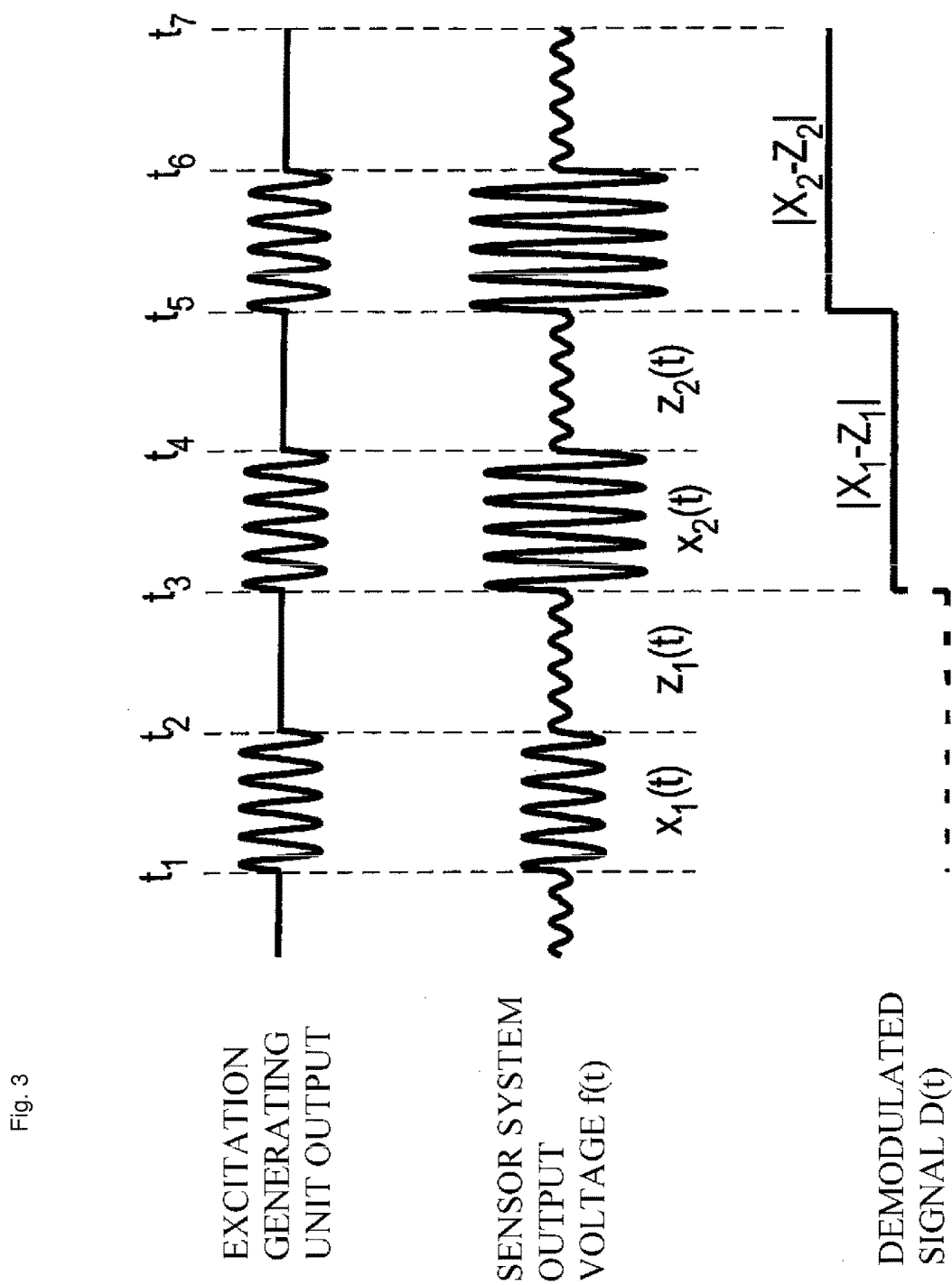
FIG. 3 is a timing chart of the electrostatic capacitance sensor of the present invention.

The excitation generating unit 102 generates an intermittent sinusoidal voltage as illustrated as the waveform at the top of FIG. 3, i.e. excitation generating unit output voltage. The sinusoidal voltage is provided to the sensor system 101 as an excitation. The frequency of the sinusoidal wave in this example is 100 kHz. In response to the excitation and the capacitance of the capacitor $C_{in}$, the sensor system outputs a voltage f(t) as illustrated as the second waveform in FIG. 3, i.e. a sensor system output voltage. Responses of the sensor system in periods in which the excitation generating unit 102 is outputting the sinusoidal wave are denoted as $x_1(t)$, $x_2(t)$ as in the figure and output voltages from the sensor system in periods in which the excitation generating unit stops outputting the sinusoidal wave are denoted as $z_1(t)$, $z_2(t)$.

According to formula 3, the amplitude of the output voltage from the sensor system is zero in the periods in which the excitation generating unit stops outputting the wave. In reality, however, the amplitude is not zero because of noise contamination. In many applications such as touch sensors and touch panels, the capacitance of the capacitor $C_{in}$ as illustrated in FIG. 2 is the capacitance of a capacitor formed by a pointing object (finger) and a resistive sheet, and external noise (electric field variations and capacitive coupling noise) is easily coupled into the resistive sheet that constitutes a part of the capacitor $C_{in}$. The reason why $z_1(t)$ and $z_2(t)$ in FIG. 3 are not zero is that they reflect the influence of the noise. When external noise is steady, there is external noise contamination regardless of whether there is sinusoidal wave excitation or the sinusoidal wave is stopped (DC), therefore noise is present in $x_1(t)$ and $x_2(t)$. In other words, a true signal plus noise (true signal+noise) appears in $x_1(t)$ and $x_2(t)$ and only noise appears in $z_1(t)$ and $z_2(t)$.

A significant finding by the inventors is that $z_1(t)$ and $z_2(t)$ are not dependent on the capacitance of the capacitor but represents external noise. In other words, in a touch sensor or a touch panel, only noise appears regardless of the presence or absence of a finger, which is a pointing object. This is because the impedance of the capacitor $C_{in}$ formed by the finger and the position sensing conductive film is sufficiently higher than the impedance of the sensor system, noise entering the position sensing conductive film is coupled into the sensor system as a current regardless of the presence or absence of a finger.

Another significant finding is that there is a correlation between noise present in the sensor system output voltage in a period during which the excitation generating unit is outputting the sinusoidal wave and noise present in the sensor system output voltages in the periods preceding and succeeding that period.

The demodulating unit 105 receives an output signal from the sensor system 101 and takes advantage of the features illustrated above to remove noise. An example will be illustrated where a true signal in $x_1(t)$, here the amplitude of a true signal in $x_1(t)$, is obtained from an observed signal $x_1(t)$ including the true signal plus noise and an observed signal $z_1(t)$ including only noise.

The demodulating unit 105 periodically reads a signal value from the sensor system output voltage f(t) at time intervals $\Delta t$ and converts the signal value into a discrete time signal $f(i\Delta t)$, where $i \in Z$ (Z is a set of integers). By sampling $x_1(t)$ in this way, $x_1(i\Delta t)$ is obtained, where $i=0, 1, 2, \ldots, N-1$, and by sampling $z_1(t)$), $z_1(i\Delta t)$ is obtained, where $i=0, 1, 2, \ldots, Q-1$.

Let $X_1$ denote the discrete Fourier transform Dk that corresponds to 100 kHz which is the frequency of the excitation sinusoidal wave among the discrete Fourier transforms Dk of $x_1(i\Delta t)$, then a complex number $X_1$ can be obtained as $$X_1 = \frac{1}{N}\sum_{i=0}^{N-1} x(i\Delta t)\exp(-j2\pi\ 100\ \text{kHz}\ i\Delta t) \quad \text{[Formula 4]}$$

where j is an imaginary unit and N is the number of samples. The complex number $X_1$ can be written as a two-dimensional vector $X_1 \equiv (\text{Re}\{X_1\}, \text{Im}\{X_1\})$, where $\text{Re}\{X_1\}$ is the real part of the complex number $X_1$ and $\text{Im}\{X_1\}$ is the imaginary part of the complex $X_1$. These are equivalent to each other.

Similarly, let $Z_1$ denote the discrete Fourier transform Dk that corresponds to 100 kHz which is the frequency of the sinusoidal wave among the discrete Fourier transforms Dk of $z_1(i\Delta t)$, then a complex number $Z_1$ can be obtained as $$Z_1 = \frac{1}{Q}\sum_{i=0}^{Q-1} z(i\Delta t)\exp(-j2\pi\ 100\ \text{kHz}\ i\Delta t) \quad \text{[Formula 5]}$$

where j is an imaginary unit and Q is the number of samples. The complex $Z_1$ can be written as a two-dimensional vector $Z_1 \equiv (\text{Re}\{Z_1\}, \text{Im}\{Z_1\})$. These are equivalent to each other.

Assuming that the 100-kHz component of noise present in the observed signal $x_1(t)$ is the same as the 100-kHz component of the observed signal $z_1(t)$, vector $X_1$-vector $Z_1$ is then calculated. The magnitude $|X_1-Z_1|$ of the result is set as the amplitude of the true signal of $x_1(t)$ and as a demodulated signal D(t) output from the demodulating unit.

The operation of the demodulating unit illustrated above will be illustrated by using a model of an observed signal and assigning specific numerical values.

Figure 4:
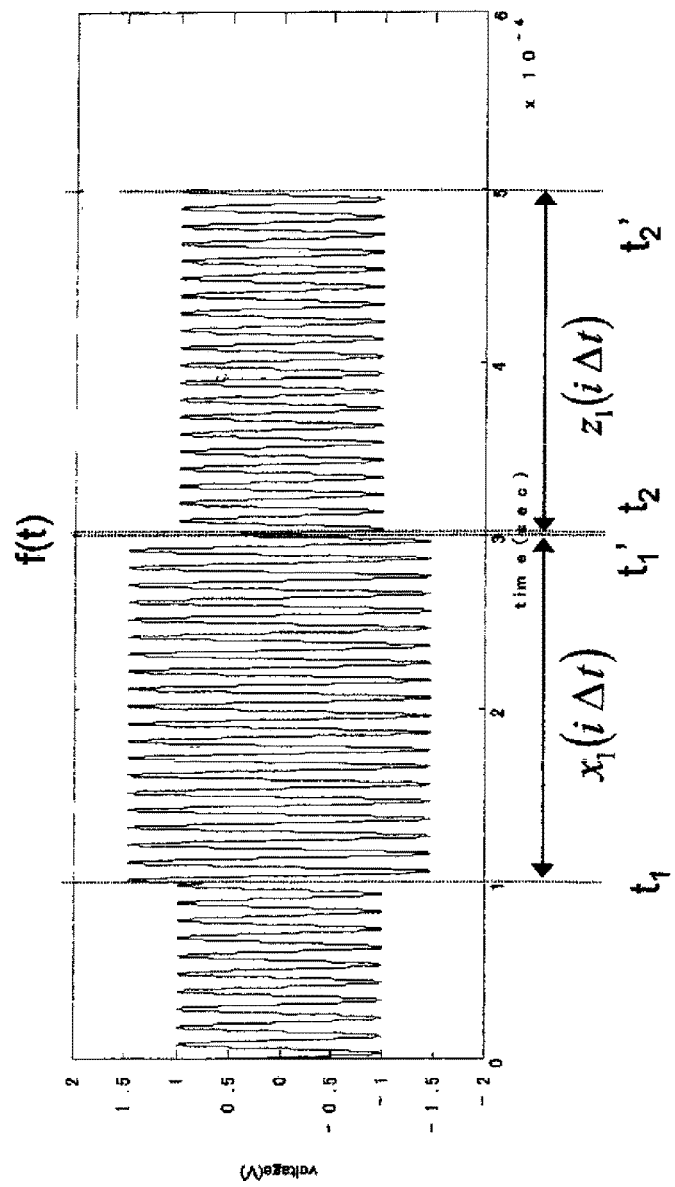
FIG. 4 is a graph of a sensor system output voltage for illustrating computations of the present invention.

The model of the observed signal is illustrated in FIG. 4. Let f(t) denote the model of the observed signal, then f(t) is true signal ($V_{sig}$) with an amplitude of 2 V plus noise ($V_{noise}$) with an amplitude of 1 V, as follows:

$$f(t) = Vsig + Vnoise \quad \text{[Formula 6]}$$

$$Vsig = \begin{cases} 2\sin(2\pi\ 100k\ t) & (0.1\ \text{msec} < t < 0.3\ \text{msec}) \\ 0 & (\text{else}) \end{cases} \quad \text{[Formula 7]}$$

$$Vnoise = \sin\left(2\pi\ 100k\ t + \frac{3}{4}\pi\right) \quad \text{[Formula 8]}$$

Sampling was performed at intervals of $\Delta t=0.1$ microseconds to discretize f(t) to $f(a\Delta t)$, where $a=0, 1, 2, \ldots, 4999$.

$x_1(i\Delta t)$ and $z_1(i\Delta t)$ are signals illustrated in FIG. 4. Considering that a 100-kHz component is to be extracted later, it is desirable that the length (time) of $x_1(i\Delta t)$, i.e. $t_1'-t_1$ be set to an integer multiple of intervals of 100 kHz, i.e. $n \times 10$ microseconds, where n is a positive integer.

Specifically, $x_1(i\Delta t)$, where $i=0$ to 1999, was set as $f(a\Delta t)$, where $a=1000$ to 2999, and $t_1'-t_1$ was set to 200 microseconds (n=20).

It is desirable that the beginning time $t_2$ of $z_1(i\Delta t)$ be set to $t_1+m \times 10$ μsec, where m is a positive integer. It is desirable that the length (time) of $z_1(t)$, i.e. $t_2'-t_2$ be set to an integer multiple of intervals of 100 kHz, i.e. $w \times 10$ microseconds, where w is a positive integer.

Specifically, $z_1(i\Delta t)$, where $i=0$ to 1999, was set as $f(a\Delta t)$, where $a=3000$ to 4999, $t_2=t_1+200$ microseconds (m=20) was set, and $t_2'-t_2$ was set to 200 microseconds (w=20).

$X_1$ and $Z_1$ were calculated to obtain the following results.

$$X_1 = \frac{1}{2000}\sum_{i=0}^{1999} x(i\Delta t)\exp(-j2\pi\ 100\ \text{kHz}\ i\Delta t) \quad \text{[Formula 9]}$$

$$= 0.3536 - j0.6464$$

$$Z_1 = \frac{1}{2000}\sum_{i=0}^{1999} z(i\Delta t)\exp(-j2\pi\ 100\ \text{kHz}\ i\Delta t) \quad \text{[Formula 10]}$$

$$= 0.3536 - j0.3536$$

Figure 5:
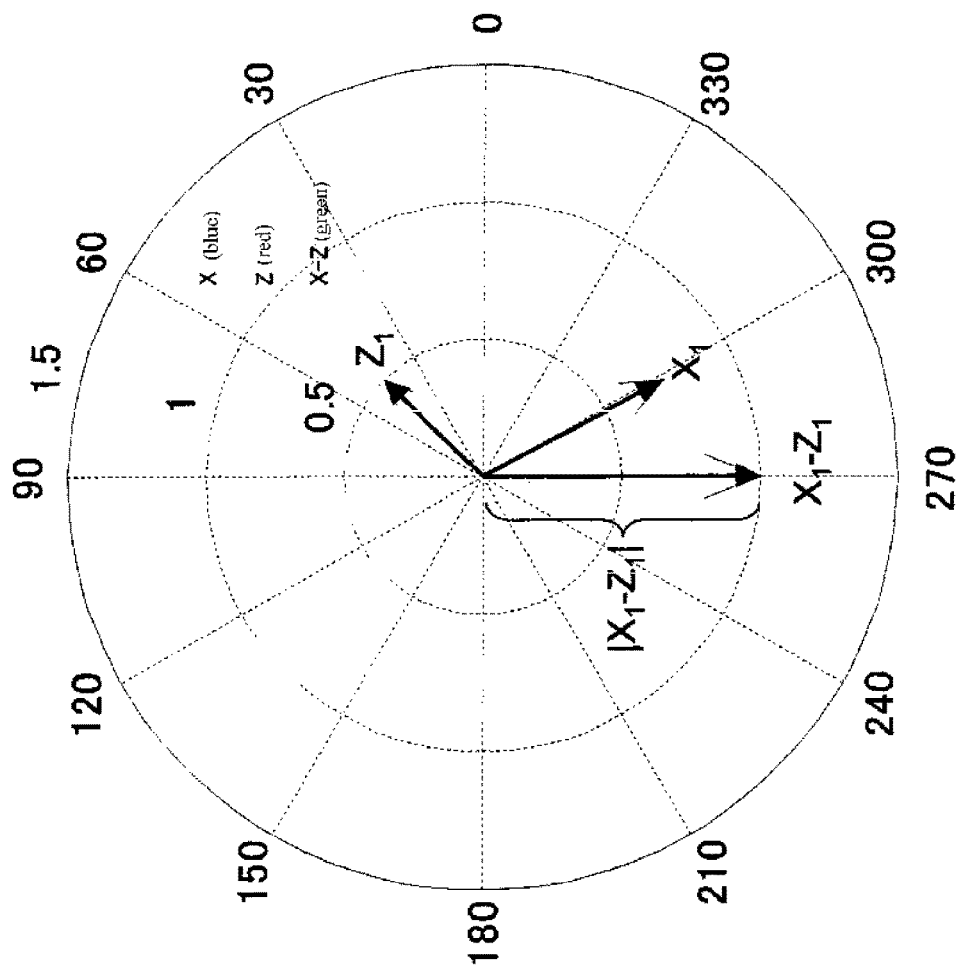
FIG. 5 is a vector diagram illustrating computations by a demodulating unit of the present invention.

The complex numbers given above are considered to be vectors, and vector $X_1$, vector $Z_1$, and vector $X_1$-vector $Z_1$ are plotted on a complex plane as in FIG. 5.

The magnitude of vector $X_1$-vector $Z_1$ is 1.0 as in the figure. By focusing attention on the fact that the magnitude of each vector in FIG. 5 is ½ of the amplitude of a signal of 100 kHz, the amplitude of the true signal was calculated as vector $X_1$-vector $Z_1$ equals 2 V. On the other hand, it is difficult to derive the amplitude (2 V) of the true signal based only on information such as the amplitude $2\times|X_1|$ (1.5 V) of calculated $x_1(i\Delta t)$ and the amplitude $2\times|Z_1|$ (1.0 V) of calculated $z_1(i\Delta t)$.

The amplitude (1.5 V) of $x_1(i\Delta t)$ and the amplitude (1.0 V) of $z_1(i\Delta t)$ are equivalent to calculated amplitudes of 100-kHz components of signals $x_1(i\Delta t)$ and $z_1(i\Delta t)$, respectively. In other words, conventional noise removal using frequency separation alone may not obtain the amplitude of the true signal.

In the foregoing, an example has been given in which $X_1$ and $Z_1$ are calculated from $x_1(i\Delta t)$ and $z_1(i\Delta t)$ and $|X_1-Z_1|$ is calculated to obtain one value of the demodulated signal $D(t)$. For the next value of $D(t)$, $X_2$ and $Z_2$ are calculated from $x_2(t)$ and $z_2(t)$ and $|X_2-Z_2|$ is calculated as illustrated in FIG. 3. For the subsequent values of $D(t)$, calculations are performed in a similar manner to obtain a demodulated signal $D(t)$.

The embodiment has two effects. The first effect is that since noise is acquired while a sinusoidal wave is stopped, noise can be accurately acquired regardless of the presence or absence of a finger or even when a finger has been placed on or removed from the panel or the pressure applied by a finger has varied to change the capacitance of the capacitor $C_{in}$.

The second effect is that since a subtraction is performed between vectors of "true signal plus noise" and "noise", the true signal can be accurately obtained even when the true signal and the noise have the same frequency.

Second Embodiment

In the first embodiment, an observed signal $z_1(i\Delta t)$ was used to obtain the amplitude of the true signal of an observed signal $x_1(i\Delta t)$. In other words, noise $z_1(i\Delta t)$ observed after an observed signal $x_1(i\Delta t)$ was used to remove noise. In the second embodiment, a mode in which noise before and after an observed signal $x_1(i\Delta t)$ is used to obtain the amplitude of a true signal of the observed signal $x_1(i\Delta t)$ will be illustrated with the focus on an operation of a demodulating unit.

Figure 6:
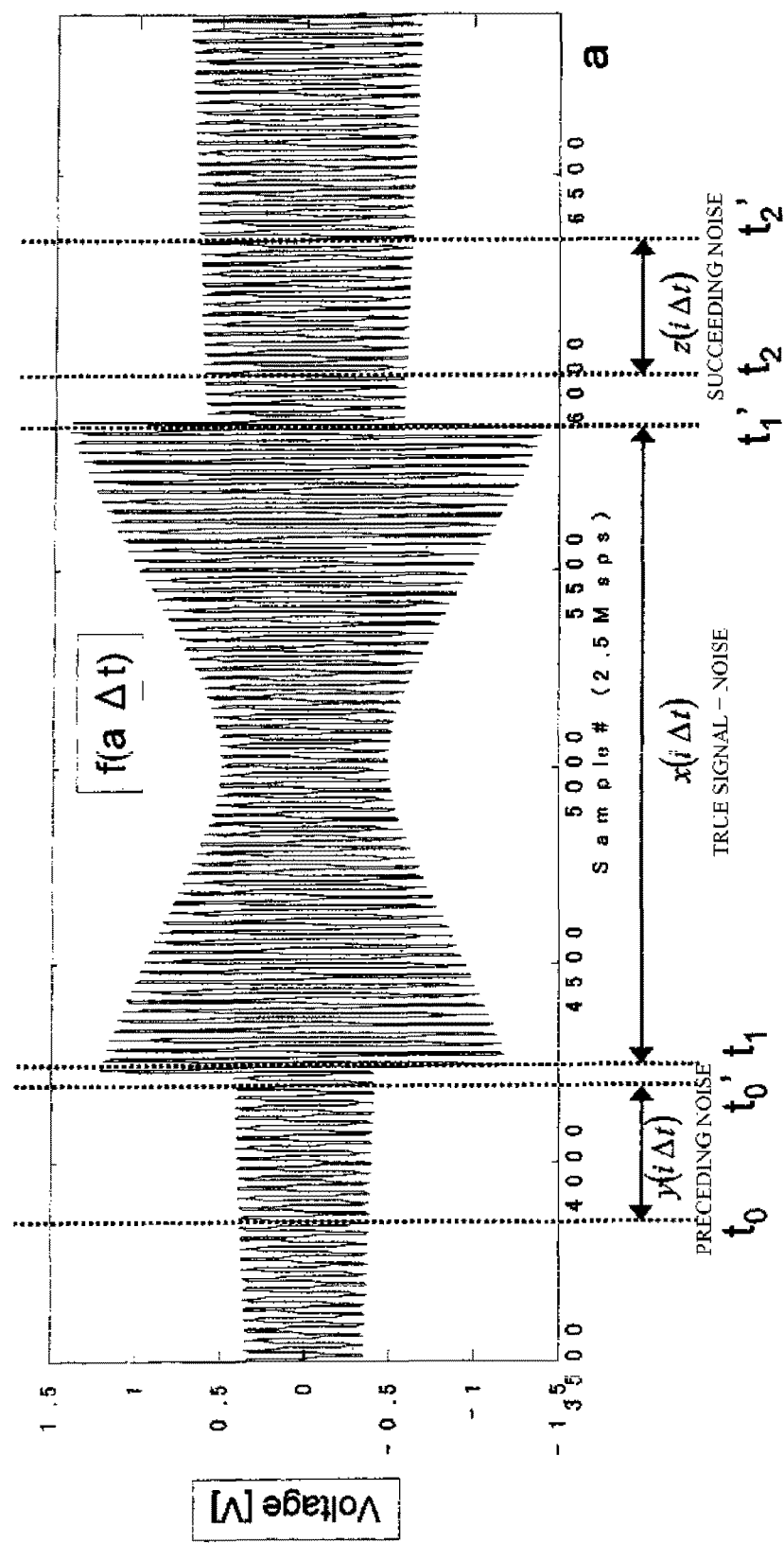
FIG. 6 illustrates a demodulating unit input voltage for illustrating computations of the present invention.

FIG. 6 illustrates a model $f(a\Delta t)$ of an observed signal obtained by discretizing a signal input in the demodulating unit 105, where $a=0, 1, 2, \ldots$, and $\Delta t=0.4$ microseconds.

$f(a\Delta t)$ is a true signal ($V_{sig}$) with an amplitude of 1 V plus noise ($V_{noise}$) of 99 kHz whose amplitude changes with time. This can be mathematically written as follows:

$$f(a\Delta t) = V_{sig} + V_{noise} \quad \text{[Formula 11]}$$

$$V_{sig} = \begin{cases} \sin(2\pi\ 100k\ a\Delta t) & (4229 < a < 5879) \\ 0 & (\text{else}) \end{cases} \quad \text{[Formula 12]}$$

$$V_{noise} = \frac{a\Delta t}{4\times 10^{-3}}\sin(2\pi\ 99k\ a\Delta t + \pi) \quad \text{[Formula 13]}$$

where $y(i\Delta t)$, $x(i\Delta t)$ and $z(i\Delta t)$ are signals extracted, respectively, from $f(a\Delta t)$ as follows:

$y(i\Delta t)$, where $i=0$ to 399 was set as $f(a\Delta t)$, where $a=3800$ to 4199; $x(i\Delta t)$, where $i=0$ to 1624, was set as $f(a\Delta t)$, where $a=4250$ to 5874; and $z(i\Delta t)$, where $i=0$ to 299, was set as $f(a\Delta t)$, where $a=6000$ to 6299.

For convenience, $y(i\Delta t)$ is herein referred to as preceding noise and $z(i\Delta t)$ is referred to as succeeding noise.

In the demodulating unit, the same method as that in the first embodiment is used to obtain complex numbers $Y_m$ and $Z_m$ from observed signals $y(i\Delta t)$ and $z(i\Delta t)$ according to the following formulas.

$$Y_m = \frac{1}{400}\sum_{i=0}^{399} y(i\Delta t)\exp(-j2\pi\ 100\ \text{kHz}\ i\Delta t) \quad \text{[Formula 14]}$$

$$Z_m = \frac{1}{300}\sum_{i=0}^{299} z(i\Delta t)\exp(-j2\pi\ 100\ \text{kHz}\ i\Delta t) \quad \text{[Formula 15]}$$

Here, $\Delta t$ is the sampling interval and $j$ is an imaginary unit.

Figure 7:
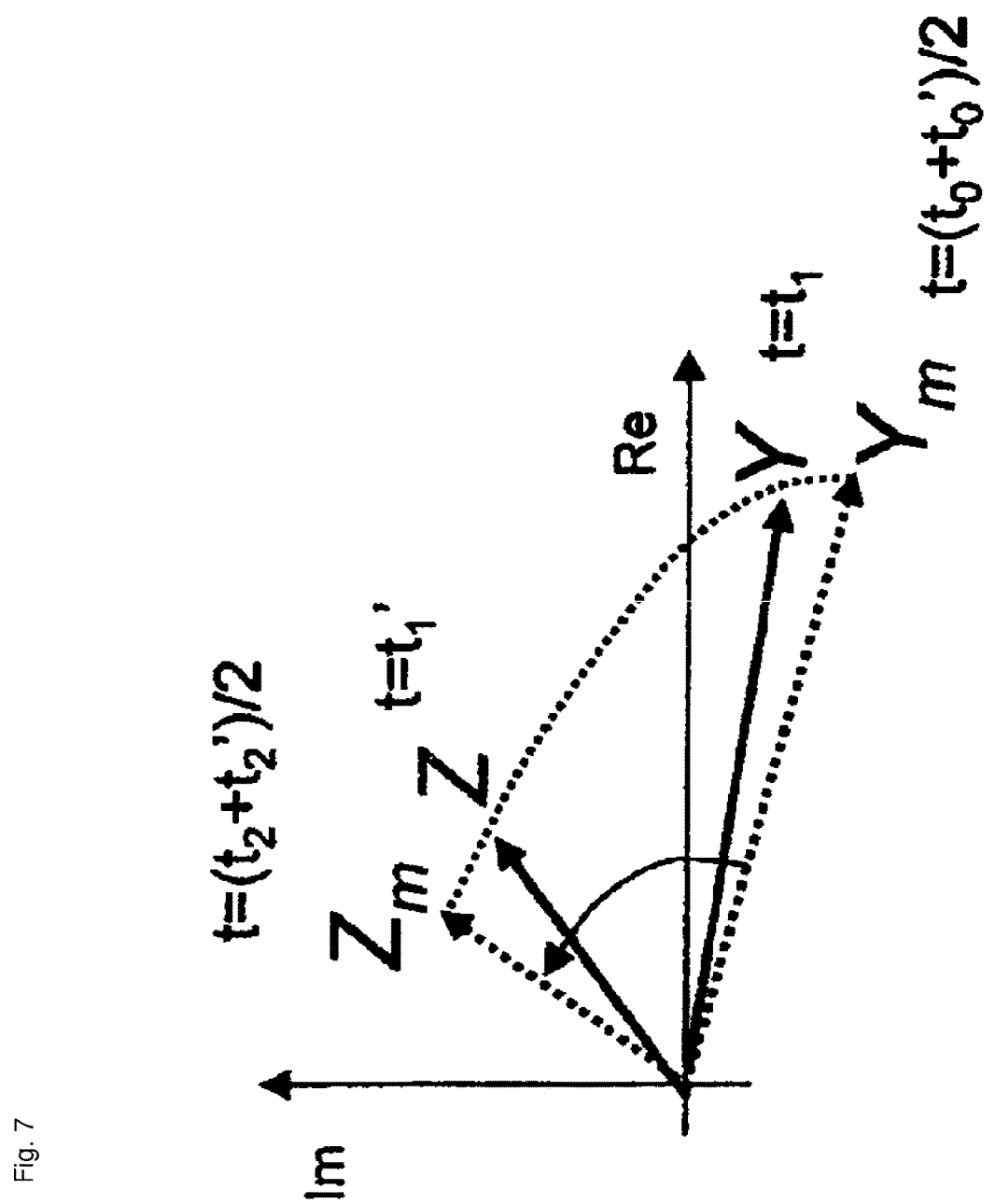
FIG. 7 is a vector diagram for illustrating a demodulating unit of the present invention.

The vectors $Y_m$ and $Z_m$ obtained here are schematically illustrated in FIG. 7.

From the vectors $Y_m$ and $Z_m$, noise vectors Y and Z at time instants $t_1$ and $t_1'$ are then estimated. The estimation method is as follows. Let $Y_m$ be the noise vector at time instant $(t_0+t_{0'})/2$ and $Z_m$ be the noise vector at time instant $(t_2+t_{2'})/2$.

Approximation is made that the amplitudes and phases of the vectors change from $Y_m$ to $Z_m$ with time, and the noise vectors Y and Z at time instants $t_1$ and $t_{1'}$ are obtained. FIG. 7 schematically illustrates the relationship between $Y_m$, $Z_m$ and Y, Z.

Figure 8:
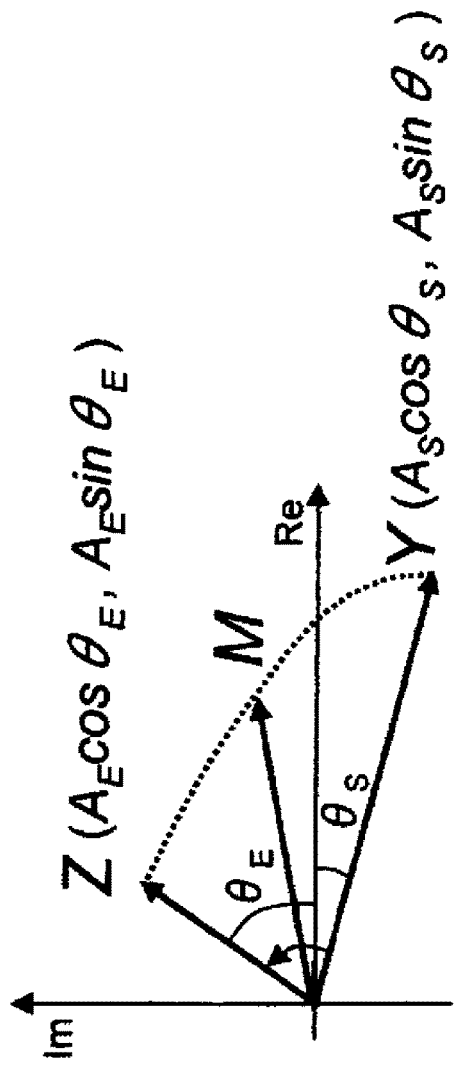
FIG. 8 is a vector diagram for illustrating the demodulating unit of the present invention.

Then, from the vectors Y and Z, the mean vector M of the vectors Y and Z is calculated. The calculation of the mean vector will be illustrated with reference to FIG. 8.

As mentioned earlier, the vector representation and the complex representation are equivalent to each other. The formula for calculating M can be written in complex representation as follows:

$$M = \frac{1}{T}\int_0^T \left(A_S - \frac{A_S-A_E}{T}t\right)\cos\left(\theta_S - \frac{\theta_S-\theta_E}{T}t\right)dt + \\ j\left\{\frac{1}{T}\int_0^T \left(A_S - \frac{A_S-A_E}{T}t\right)\sin\left(\theta_S - \frac{\theta_S-\theta_E}{T}t\right)dt\right\} \quad \text{[Formula 16]}$$

Figure 9:
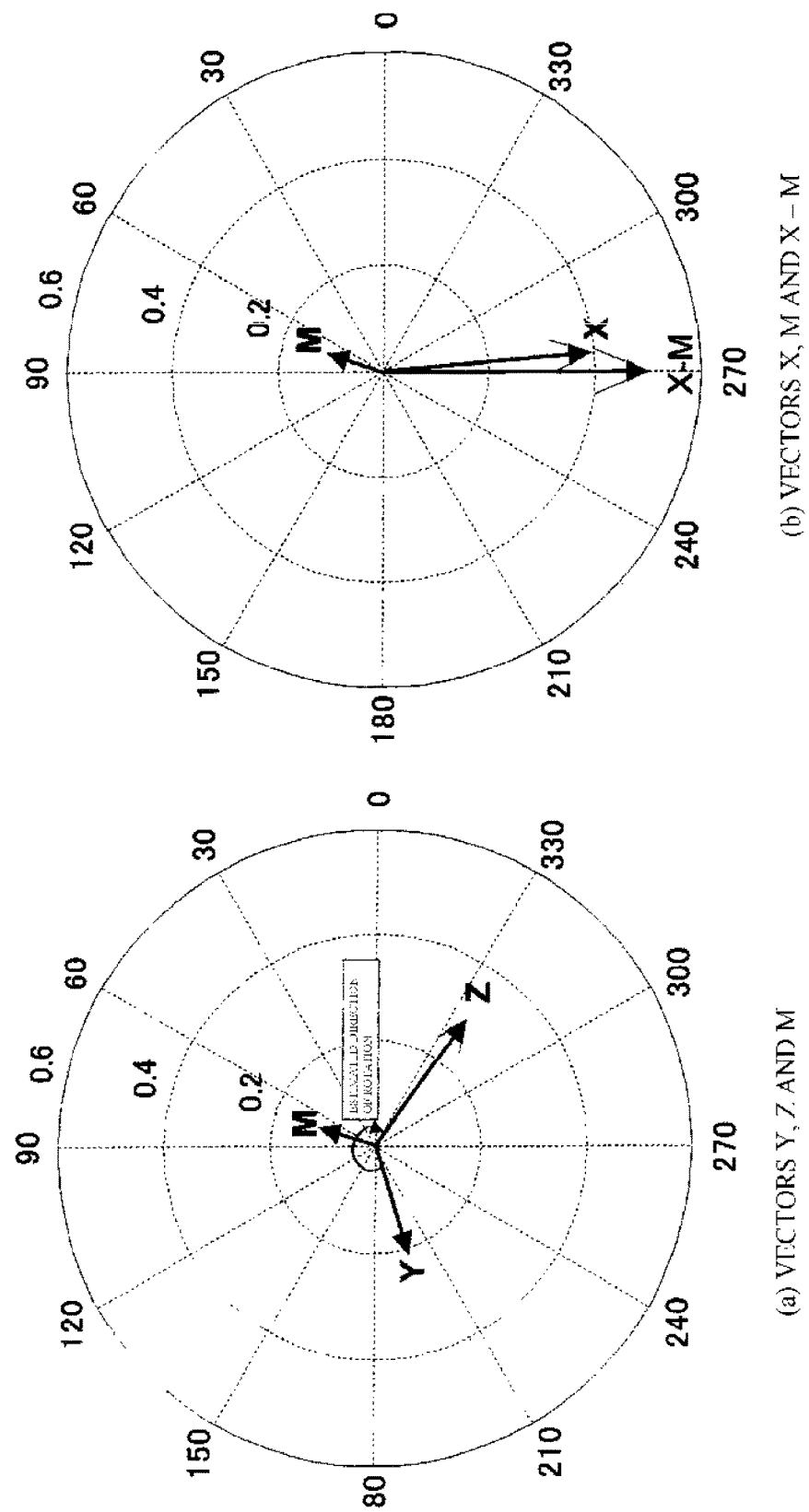
FIG. 9 is a vector diagram for illustrating the demodulating unit of the present invention.

Here, T represents $t_{1'}$-$t_1$ in FIG. 6, $A_S$ and $\theta_S$ represent the amplitude and phase of the vector Y, respectively, and $A_E$ and $\theta_E$ represent the amplitude and phase of the vector Z, respectively. FIG. 9(*a*) illustrates Y, Z and M obtained from the model signal in FIG. 6 according to the foregoing.

Then, X is obtained in the same way as in the first embodiment and X–M is calculated. X can be written as follows:

$$X = \frac{1}{1625}\sum_{i=0}^{1624} x(i\Delta t)\exp(-j2\pi\ 100\ \text{kHz}\ i\Delta t) \quad \text{[Formula 17]}$$

Here, $\Delta t$ is the sampling interval and $j$ is an imaginary unit.

FIG. 9(*b*) illustrates X obtained from $x(i\Delta t)$ in FIG. 6, and M and X–M obtained earlier.

From FIG. 9(*b*), |X–M| is 0.5, and taking note of the fact that this value is ½ of the amplitude of the true signal, it has been confirmed that the amplitude of the true signal, 1.0 V can be correctly obtained. In other words, it has been shown that if noise of 99 kHz, which is very close to the excitation frequency, 100 kHz, is present, the noise can be precisely removed.

Generally, when the signal acquisition periods are limited as in the case of $x(i\Delta t)$, frequency resolution is reduced and noise close to the frequency of a true signal may not be removed. In this embodiment, on the other hand, noise close to the frequency of a true signal can be removed beyond frequency resolution by using noise $y(i\Delta t)$ preceding to $x(i\Delta t)$ and noise $z(i\Delta t)$ succeeding to $x(i\Delta t)$ as illustrated.

Further, as illustrated in this embodiment, the mean vector M can be used to precisely remove noise even when the amplitude of the noise is dependent on time.

Effects

The embodiment has the following two effects.

First, by using the mean vector calculated from preceding noise and succeeding noise, noise close to the frequency of a true signal can be removed beyond frequency resolution.

Second, by using the mean vector calculated from preceding noise and succeeding noise, noise can be precisely removed even when the amplitude of noise has changed.

Examples

A capacitive touch panel of the present invention will be illustrated.

(Configuration)

Figure 10:
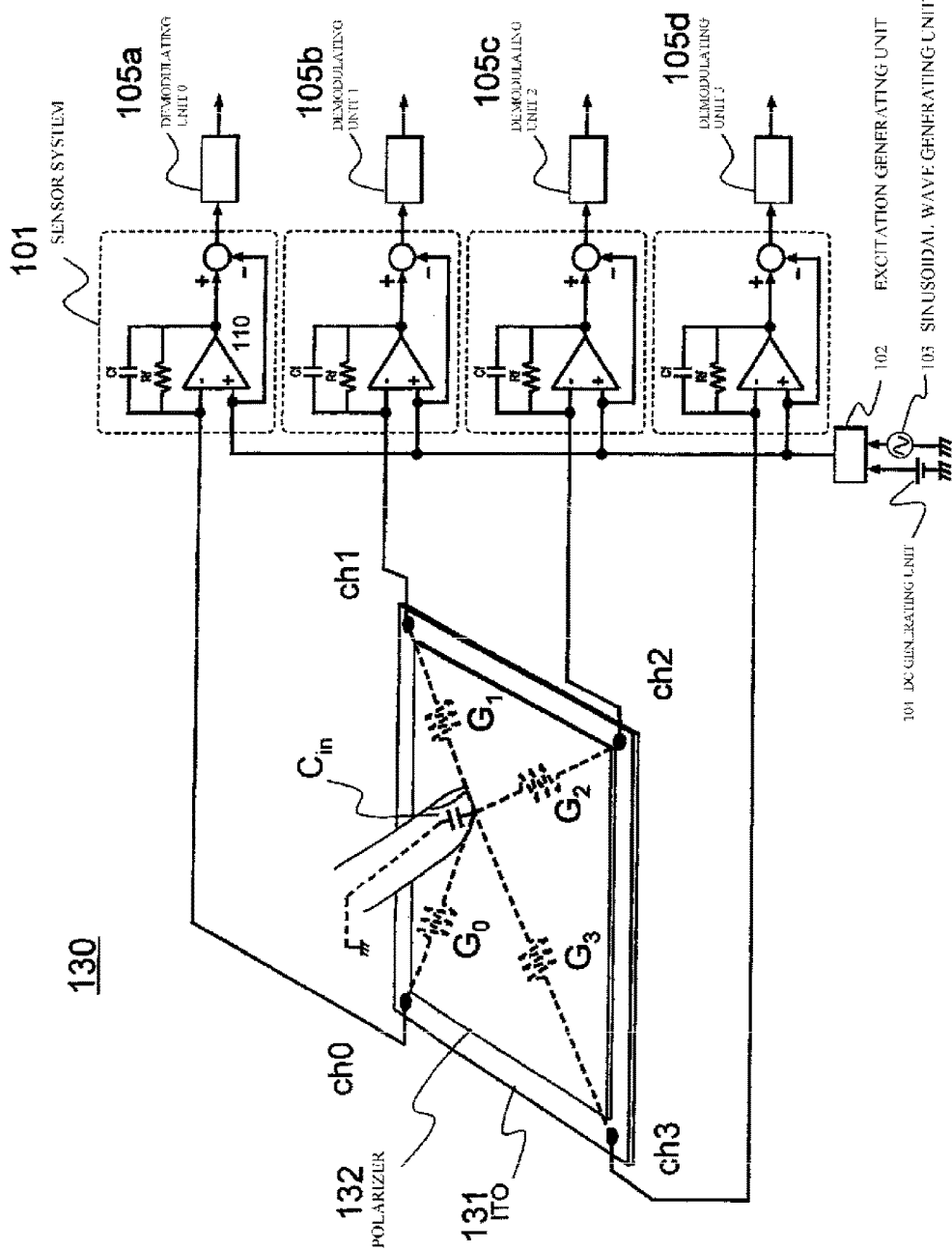
FIG. 10 is a configuration diagram of a capacitive touch panel of the present invention.

FIG. 10 illustrates a configuration of a capacitive touch panel 130 of the present invention. The touch panel illustrated in FIG. 10 uses the capacitance of a capacitor $C_{in}$ formed between a finger and a resistive sheet 131 to detect the presence or absence of a touch and the position of the touch.

An ITO (Indium-Tin-Oxide) film is used for the resistive sheet 131. The ITO film is a solid film having a uniform sheet resistance value, 800 ohms in this example, provided on a glass substrate, not depicted. An insulator, which is a polarizer 132 used for forming a liquid-crystal display in this example, is attached on the ITO film with an acid-free adhesive.

Wiring lines are connected to the four corners of the ITO film 131. The wiring lines are connected to four sensor systems 101. The configuration of each of the sensor systems is the same as that in the first embodiment. Each of the four sensor systems takes an input of an output voltage from an excitation generating unit 102 and an output from each of the sensor systems is provided to an associated one of demodulating units 105 (demodulating units 0 to 3).

Outputs from the demodulating units are provided to a block, not depicted, including a signal processing circuit and the presence or absence of a touch and the position of the touch is calculated in the block including the signal processing circuit on the basis of the outputs from the demodulating units.

(Operation)

Operations of the capacitive touch panel of the present invention will be illustrated with reference to FIG. 11.

The capacitive touch panel of the present invention is assembled on the display surface of a liquid-crystal display (LCD) and is driven in such a manner that LCD drive noise is avoided.

Figure 11:
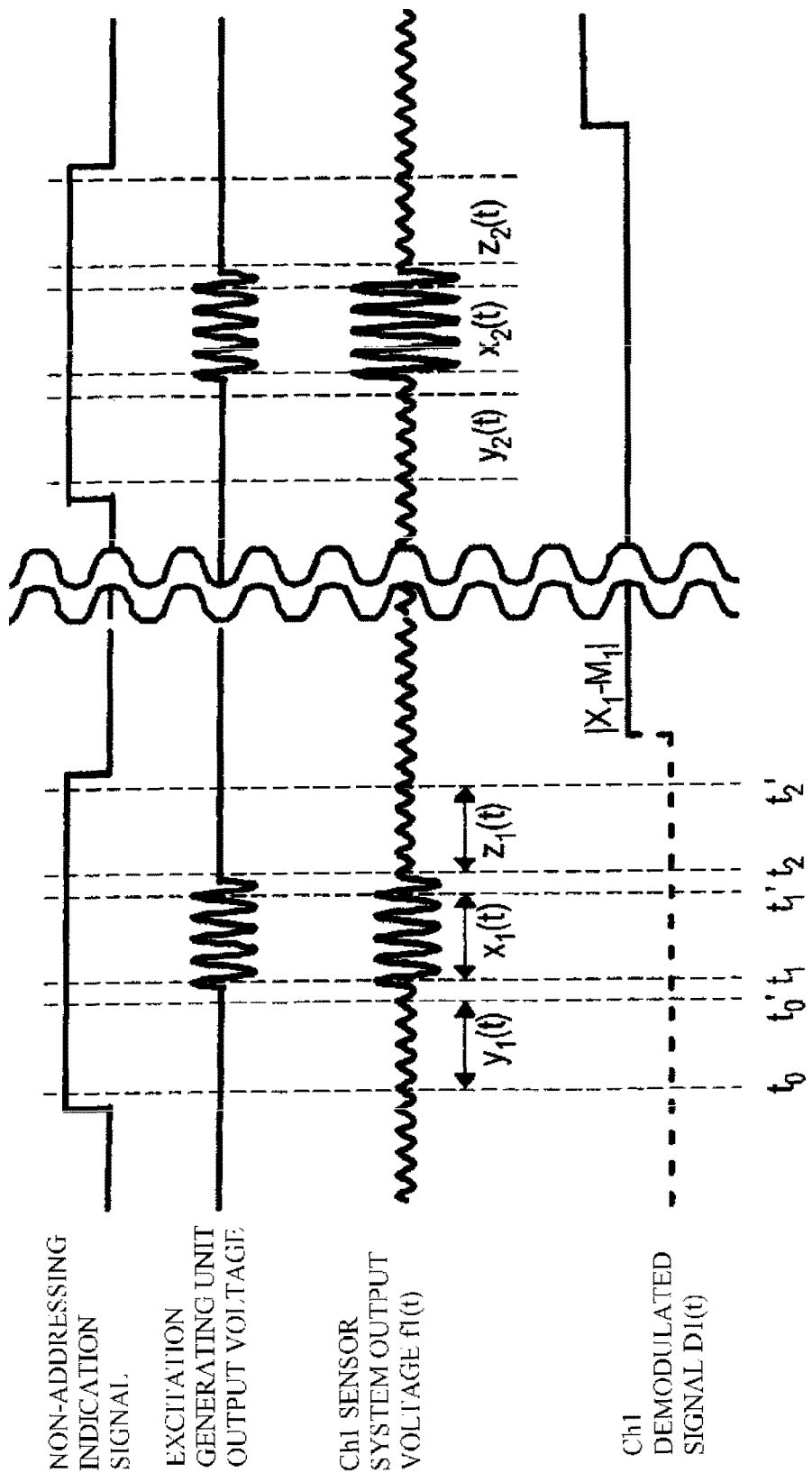
FIG. 11 is a timing chart of the capacitive touch panel of the present invention.

A non-addressing indication signal in FIG. 11 is a signal that explicitly indicates a non-addressing period of the LCD and is high in a non-addressing period. The term non-addressing period herein refers to a period during which the scan lines of the LCD are not scanned and is the period from the end of selection of the last scan line to selection of the first scan line.

One of the features of the drive of the present invention is that there is a period ($t_1$ to $t_{1'}$) during which a sinusoidal wave is provided for excitation to sense a touch during a non-addressing period and there are periods ($t_0$ to $t_{0'}$ and $t_2$ to $t_{2'}$) during which the sinusoidal wave is stopped and noise is acquired.

Since noise is acquired during a non-addressing period, the noise includes external noise but does not include LCD drive noise. Consequently, noise present in a period ($t_1$ to $t_{1'}$) in which a touch is sensed can be precisely estimated and removed.

The excitation generating unit 102 generates an intermittent sinusoidal voltage as illustrated as the second waveform from the top of FIG. 11. The sinusoidal voltage is used for excitation of the sensor systems. In order to obtain the excitation generating unit output voltage in FIG. 11, the excitation generating unit is provided with a sinusoidal wave with a frequency of 100 kHz and an amplitude of 1.5 $V_{pp}$ (1.5 volts peak-to-peak) from a sinusoidal wave generating unit 103 and a DC voltage of DC=1.2 V from an DC generating unit 104. The excitation generating unit outputs an intermittent sinusoidal voltage with an offset of 1.2 V, a frequency of 100 kHz and an amplitude of 1.5 $V_{pp}$. In a period during which the sinusoidal wave is stopped, the excitation generating unit outputs a voltage of DC=1.2 V.

The voltage generated by the excitation generating unit is provided to the four sensor systems 101, which are herein referred to as the sensor system of ch0, the sensor system of ch1, the sensor system of ch2, and the sensor system of ch3 for convenience. The voltage generated by the excitation generating unit 102 is provided to a non-inverting input terminal of an operational amplifier 110 in each sensor system and the voltage appears at an inverting input terminal due to an imaginary short operation of the operational amplifier. Specifically, when the excitation generating unit 102 outputs a voltage with a frequency of 100 kHz and an amplitude of 1.5 $V_{pp}$, the voltage with a frequency 100 kHz and an amplitude of 1.5 $V_{pp}$ is applied to the ITO 131.

When the capacitance of a capacitor $C_{in}$ is formed, an AC current flows to the human body from each sensor system through corresponding conductance $G_0$ to $G_3$, which is determined according to the position of the finger, and the capacitor $C_{in}$.

An output from each sensor system is the intermittent sinusoidal voltage on which noise is superimposed and the amplitude of the output is determined by the magnitude of the AC current. The sensor system of ch1 is chosen as a representative example from among the sensor systems and the output voltage of the sensor system of ch1 is illustrated as $f_1(t)$ in FIG. 11.

An operation of the demodulating unit 105 will be illustrated by taking ch1 as an example.

The demodulating unit 105b of ch1 uses signals $y_n(t)$, $x_n(t)$ and $z_n(t)$, where n is an integer, of the output voltage $f_1(t)$ from the sensor system of ch1, as illustrated in FIG. 11, to output the amplitude $D_1(t)$ of a true signal of $x_n(t)$.

In the demodulating unit 105b, the output voltage $f_1(t)$ from the sensor system is sampled at sampling intervals $\Delta t=0.4$ microseconds to obtain $f_1(a\Delta t)$, where a is an integer sample number.

$x_1(i\Delta t)$, $y_1(i\Delta t)$, $z_1(i\Delta t)$ are signals extracted, respectively, from $f_1(a\Delta t)$ as follows: $y_1(i\Delta t)$, where i=0 to 399, was set as $f(a\Delta t)$, where a=3801 to 4200; $x_1(i\Delta t)$, where i=0 to 1624, was set as $f(a\Delta t)$, where a=4251 to 5875; and $z_1(i\Delta t)$, where i=0 to 399, was set as $f(a\Delta t)$, where a=6001 to 6400.

In this example, each of periods corresponding to $y_1(t)$ and $z_1(t)$ is divided into four segments and a vector of a 100-kHz component is calculated for each of the segments in order to accurately estimate a phase rotation of noise.

Specifically, the calculations are illustrated by formulas 18 to 25 given below.

$$Y_{1,1} = \frac{1}{100}\sum_{i=0}^{99} y\{(i)\Delta t\}\exp(-j2\pi\ 100\ \text{kHz}\ i\Delta t) \quad [\text{Formula 18}]$$

$$Y_{1,2} = \frac{1}{100}\sum_{i=0}^{99} y\{(i+100)\Delta t\}\exp(-j2\pi\ 100\ \text{kHz}\ i\Delta t) \quad [\text{Formula 19}]$$

$$Y_{1,3} = \frac{1}{100}\sum_{i=0}^{99} y\{(i+200)\Delta t\}\exp(-j2\pi\ 100\ \text{kHz}\ i\Delta t) \quad [\text{Formula 20}]$$

$$Y_{1,4} = \frac{1}{100}\sum_{i=0}^{99} y\{(i+300)\Delta t\}\exp(-j2\pi\ 100\ \text{kHz}\ i\Delta t) \quad [\text{Formula 21}]$$

$$Z_{1,1} = \frac{1}{100}\sum_{i=0}^{99} z\{(i)\Delta t\}\exp(-j2\pi\ 100\ \text{kHz}\ i\Delta t) \quad [\text{Formula 22}]$$

$$Z_{1,2} = \frac{1}{100}\sum_{i=0}^{99} z\{(i+100)\Delta t\}\exp(-j2\pi\ 100\ \text{kHz}\ i\Delta t) \quad [\text{Formula 23}]$$

$$Z_{1,3} = \frac{1}{100}\sum_{i=0}^{99} z\{(i+200)\Delta t\}\exp(-j2\pi\ 100\ \text{kHz}\ i\Delta t) \quad [\text{Formula 24}]$$

$$Z_{1,4} = \frac{1}{100}\sum_{i=0}^{99} z\{(i+300)\Delta t\}\exp(-j2\pi\ 100\ \text{kHz}\ i\Delta t) \quad [\text{Formula 25}]$$

Then, the amplitudes and phases of preceding noise and succeeding noise are obtained.

The mean value of the amplitudes of the segments is calculated first as follows. The amplitude $|Y_m|$ of preceding noise and the amplitude $|Z_m|$ of succeeding noise are each calculated as:

$$|Y_m|=(|Y_{1,1}|+|Y_{1,2}|+|Y_{1,3}|+|Y_{1,4}|)/4 \quad [\text{Formula 26}]$$

$$|Z_m|=(|Z_{1,1}|+|Z_{1,2}|+|Z_{1,3}|+|Z_{1,4}|)/4 \quad [\text{Formula 27}]$$

The phase of each segment is calculated from the results of the calculations of Formulas 18 to 25 as follows.

angle $[Y_{1,1}]$, angle $[Y_{1,2}]$, angle $[Y_{1,3}]$, angle $[Y_{1,4}]$, and angle $[Z_{1,1}]$ angle $[Z_{1,2}]$, angle $[Z_{1,3}]$, angle $[Z_{1,4}]$. Here, angle $[Y_{1,1}]$ represents the phase of $Y_{1,1}$.

The phases calculated above are limited within the range of ±π. Since this is inconvenient for phase estimation, 2nπ, where n is an integer, is added as appropriate to smoothly link the phases.

This operation can be better understood from observation of actual shifts of phase of a 100-kHz component of a sensor system output containing external noise from an inverter circuit of a fluorescent lamp.

Figure 12:
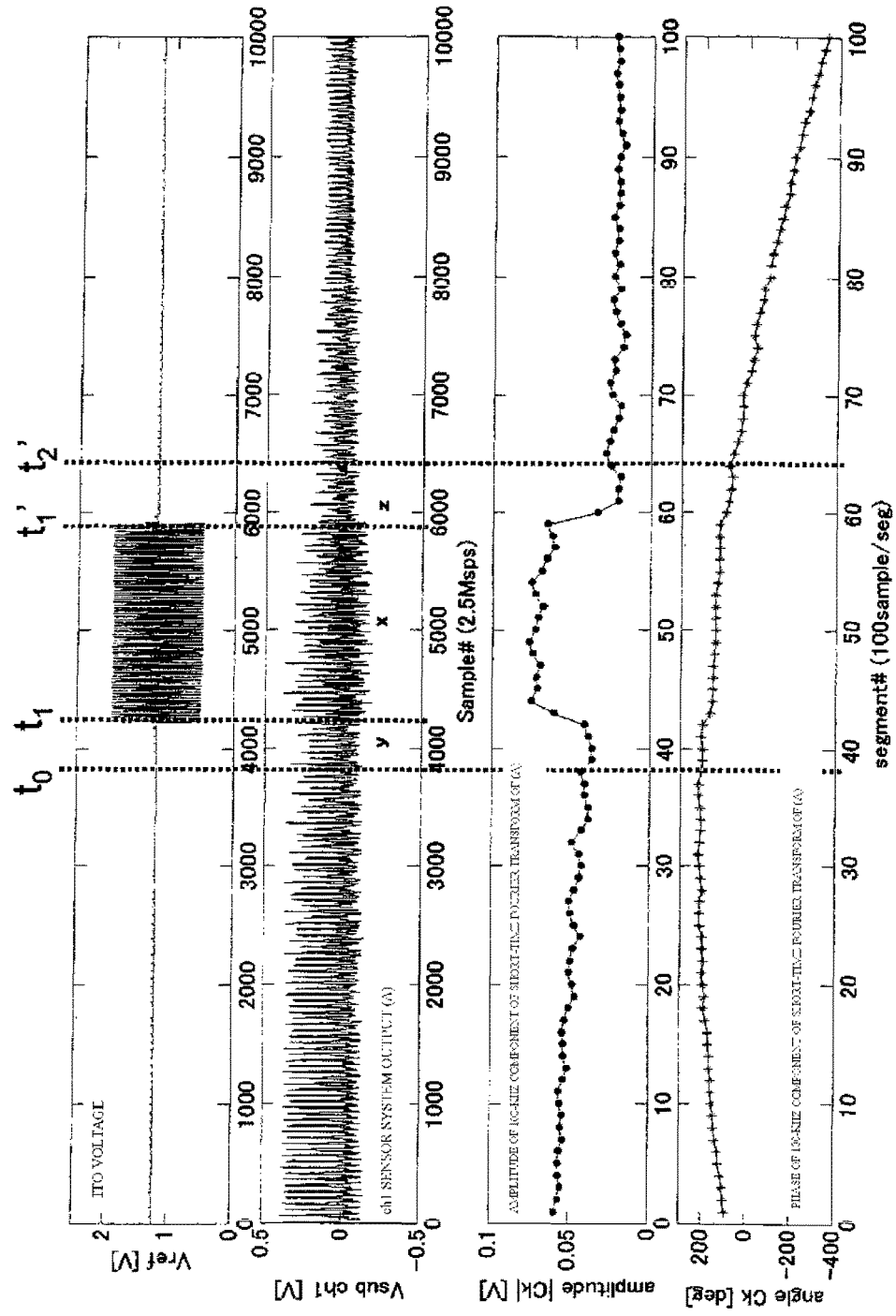
FIG. 12 illustrates signal waveforms of the capacitive touch panel of the present invention.

FIG. 12 illustrates waveforms obtained by driving a capacitive touch panel of the present invention located near an inverter circuit of a fluorescent lamp. The chart at the top represents the voltage of the ITO, the second one from the top represents a waveform obtained by sampling a sensor system output of ch1, the third one represents the amplitude of a 100-kHz component calculated from each segment including 100 samples, and the chart at the bottom represents the phase of the 100-kHz component calculated from each segment including 100 samples. The chart at the bottom is the result of addition of 2nπ, where n is an integer, to the phases limited within the range of ±π to smoothly link the phases.

The result shows smooth phase variations and it can be seen from the result that the phases can be smoothly linked by adding 2nπ as appropriate, where n is an integer.

Further, the gradients of the four phases angle $[Y_{1,1}]$, angle $[Y_{1,2}]$, angle $[Y_{1,3}]$ and angle $[Y_{1,4}]$ obtained from the preceding noise and angle $[Z_{1,1}]$, angle $[Z_{1,2}]$, angle $[Z_{1,3}]$ and angle $[Z_{1,4}]$ obtained from the succeeding noise are used to estimate in which direction the phase has rotated during the period from the preceding noise to the succeeding noise, and to what degree.

Let angle $[Y_{1,1}]'$, angle $[Y_{1,2}]'$, angle $[Y_{1,3}]'$, angle $[Y_{1,4}]'$ and angle $[Z_{1,1}]'$, angle $[Z_{1,2}]'$, angle $[Z_{1,3}]'$, angle $[Z_{1,4}]'$ denote phases that have undergone the two processes illustrated above, i.e. the process for removing the limitations of the range of ±π and the process for estimating the direction and degree of rotation from the gradients of the phases of the preceding noise and the succeeding noise. Then the phase angle $[Y_m]$ of the preceding noise and the phase angle $[Z_m]$ of the succeeding noise are calculated as follows.

$$\text{angle}[Y_m]=(\text{angle}[Y_{1,1}]'+\text{angle}[Y_{1,2}]'+\text{angle}[Y_{1,3}]'+\text{angle}[Y_{1,4}]')/4 \quad [\text{Formula 28}]$$

$$\text{angle}[Z_m]=(\text{angle}[Z_{1,1}]'+\text{angle}[Z_{1,2}]'+\text{angle}[Z_{1,3}]'+\text{angle}[Z_{1,4}]')/4 \quad [\text{Formula 29}]$$

Note that it can also be seen from the third chart from the top of FIG. 12 that the amplitude of noise present in the period x(t) can be estimated by approximation by linking the preceding noise and the succeeding noise by straight lines.

Vector $Y_m$ is determined by $|Y_m|$ and angle $[Y_m]$ obtained above and vector $Z_m$ is determined by $|Z_m|$ and angle $[Z_m]$ obtained above.

Then, noise vectors Y and Z at time instants $t_1$ and $t_{1'}$ are estimated from $Y_m$ and $Z_m$ according to the procedure described in the second embodiment.

Then, the mean vector $M_1$ of the vectors Y and Z is calculated from the vectors Y and Z according the procedure described in the second embodiment.

Further, vector $X_1$ is obtained and $X_1$-$M_1$ is calculated. X can be written as the following formula.

$$X_1 = \frac{1}{1625}\sum_{i=0}^{1624} x\{i\Delta t\}\exp(-j2\pi\ 100\ \text{kHz}\ i\Delta t) \quad [\text{Formula 30}]$$

Here, Δt is the sampling interval and j is an imaginary unit. The magnitude $|X_1-M_1|$ of the vector $X_1$-$M_1$ is output as the output $D_1(t)$ from the demodulating unit 105b as illustrated in FIG. 11.

In the next non-addressing period, $|X_2-M_2|$ is calculated similarly from $y_2(t)$, $x_2(t)$ and $z_2(t)$ and is output from the demodulating unit as illustrated in FIG. 11.

In this way, $|X_n-M_n|$ is calculated from $y_n(t)$, $x_n(t)$ and $z_n(t)$ and is output from the demodulating unit.

A block diagram of a signal processing unit for obtaining $Y_{1,1}, Y_{1,2}, Y_{1,3}, \ldots, X_1, \ldots, Z_{1,3}, Z_{1,4}$ from an output voltage $f_1(t)$ of the sensor system illustrated above will be illustrated with reference to FIG. 13.

Figure 13:
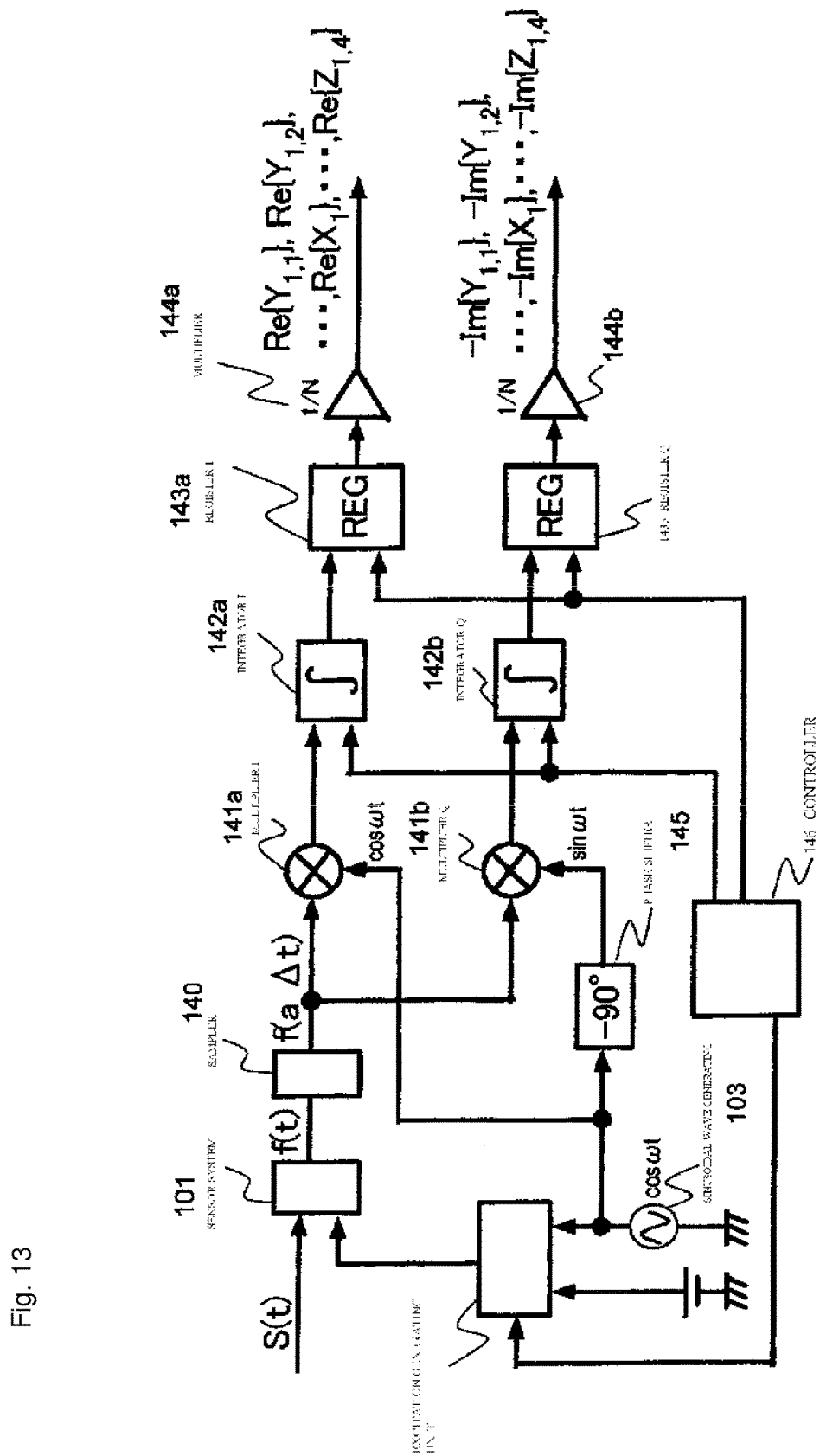
FIG. 13 is a block diagram illustrating signal processing in the capacitive touch panel of the present invention.

Output f(t) of the sensor system 101 in FIG. 13 corresponds to the output voltage $f_1(t)$ of the sensor system illustrated above with reference to FIG. 10. f(t) is provided to a sampler 140, in which f(t) is converted to a discrete-time signal f(aΔt), where a=0, 1, 2, . . . , with time intervals Δt=0.4 microseconds. Then f(aΔt) is input into two multipliers (multiplier I 141a and multiplier Q 141b). The multiplier I 141a sequentially multiplies f(aΔt) by cos (ωaΔt), where a=0, 1, 2, 3, . . . and ω=2π100 kHz, and sequentially outputs the result at time intervals Δt. Similarly, the multiplier Q 141b sequentially multiplies f(aΔt) by sin (ωaΔt), where a=0, 1, 2, 3, . . . and ω=2π100 kHz and sequentially outputs the result at time intervals Δt.

An output of a sinusoidal wave generating unit 103 is used as cos (ωaΔt) in the multiplier I; a signal obtained by converting the output from the sinusoidal generating unit by passing through a −90-degree phase-shifter 145 is used as sin (ωaΔt) in the multiplier Q.

The outputs from the multipliers I 141a and Q 141b are input into integrators I 142a and Q 142b, respectively, and the integrators add a signal input in a period during which a control signal provided from a controller 146 is active.

For example, to obtain Y1, 1, the controller provides an active signal to the integrators in a period during which the value of a in f(aΔt) is 3801 to 3900. This causes the integrator I 142a to calculate $$\sum_{a=3801}^{3900} f(a\Delta t)\cos(\omega a\Delta t) = \sum_{i=0}^{99} y_1(i\Delta t)\cos(\omega a\Delta t) \qquad \text{[Formula 31]}$$

In other words, a value which is one hundred times that of the real part of $Y_{1,1}$ in formula 17 is calculated.

Signals integrated in a predetermined time period taken into a register I 143a and a register Q 14 n 3b and are multiplied by 1/N (N is the number of integrated samples) by multipliers 144 connected to the registers.

Through this process, the multiplier I 144a sequentially outputs the real parts of $Y_{1,1}, Y_{1,2}, Y_{1,3}, \ldots, X_1, \ldots, Z_{1,3}, Z_{1,4}$, i.e. the values of $\text{Re}\{Y_{1,1}\}, \text{Re}\{Y_{1,2}\}, \text{Re}\{Y_{1,3}\}, \ldots, \text{Re}\{X_1\}, \ldots, \text{Re}\{Z_{1,3}\}, \text{Re}\{Z_{1,4}\}$, and the multiplier Q 144b sequentially outputs the imaginary parts of $Y_{1,1}, Y_{1,2}, Y_{1,3}, \ldots, X_1, \ldots, Z_{1,3}, Z_{1,4}$ multiplied by −1, i.e. the values of $-\text{Im}\{Y_{1,1}\}, -\text{Im}\{Y_{1,2}\}, -\text{Im}\{Y_{1,3}\}, \ldots, -\text{Im}\{X_1\}, \ldots -\text{Im}\{Z_{1,3}\}, -\text{Im}\{Z_{1,4}\}$.

These values are sequentially input into a computer, not depicted, in which the magnitudes and phases are calculated.

Results of an experiment on noise removal using the present invention and conventional noise removal, i.e. noise removal using only frequency separation will now be described.

For the experiment, a touch panel in FIG. 10 was provided and an inverter circuit of an inverter fluorescent lamp was placed 30 cm above the touch panel. Outputs from sensor systems were observed and it was found that noise from the inverter circuit is obviously present in the outputs.

Figure 14:
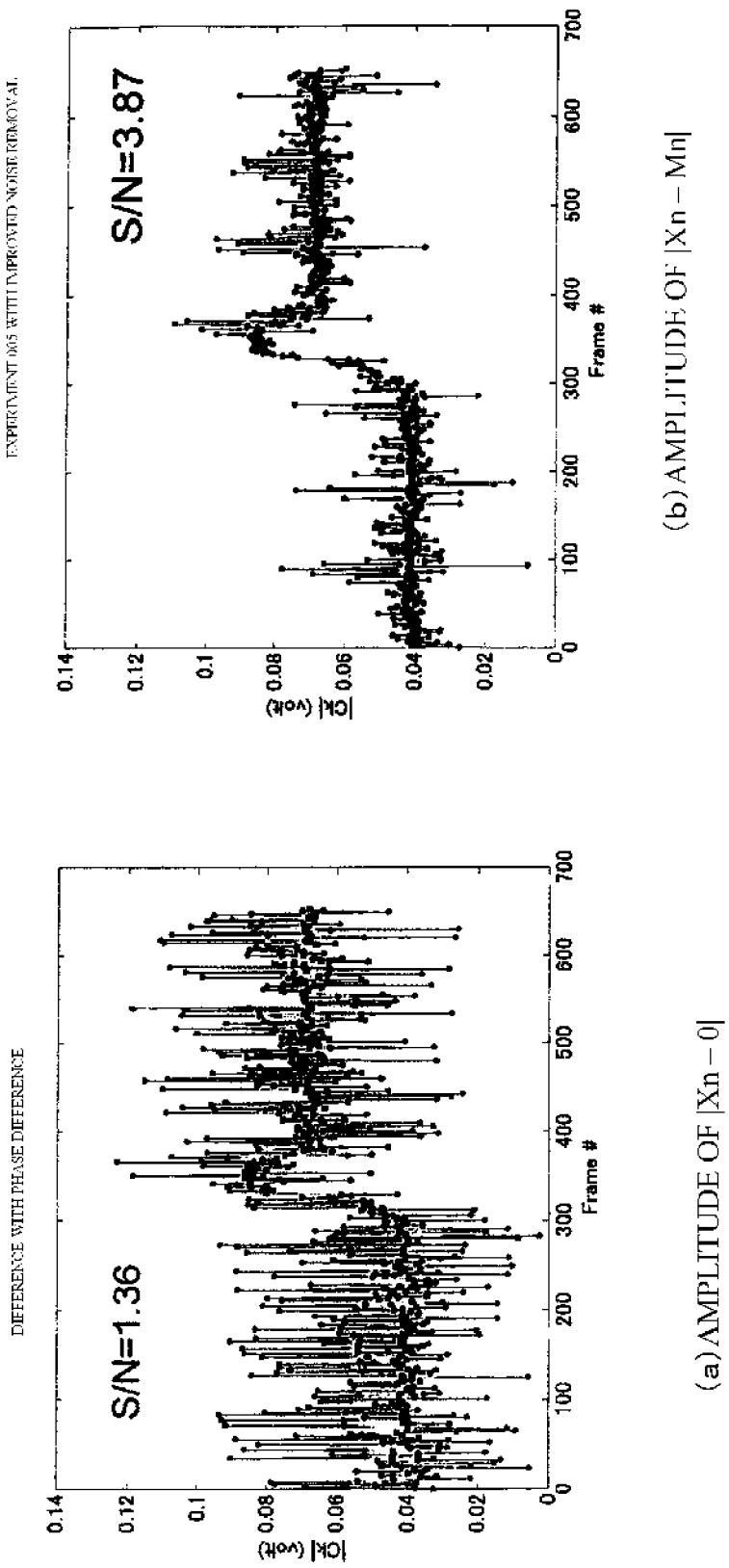
FIG. 14 illustrates signal waveforms of the capacitive touch panel of the present invention.

The measurement was made for approximately 10 seconds and, approximately 5 seconds after the start of the measurement, the center of the touch panel was touched with a finger. Results of the experiment are illustrated in FIG. 14.

FIG. 14(b) illustrates the result of the experiment with the present invention. Each of |Xn-Mn|, which was an output of $D_1(t)$, was plotted as one point and 653 points were linked by straight lines.

On the other hand, FIG. 14(a) illustrates the result of the experiment on noise removal using only frequency separation. Specifically, the amplitude of a 100-kHz component of an output signal from the sensor system in a period of a sinusoidal wave with a 100 kHz excitation was obtained by |Xn-0|.

It has been confirmed that implementation of the present invention achieves a 9 dB improvement in signal-to-noise ratio, from conventional 1.36 to 3.87 in the present invention, where the signal S is the magnitude of signal difference between the presence and absence of a touch and the noise N is the standard deviation in the absence of a touch.

INDUSTRIAL APPLICABILITY

The present invention is applicable to electronic devices that use an amplitude modulation and demodulation system, such as electrostatic capacitance sensors, touch panels, touch sensors, and the like.

DESCRIPTION OF SYMBOLS

100: Electrostatic capacitance sensor
101: Sensor system
102: Excitation generating unit
103: Sinusoidal wave generating unit
104: DC generating unit
105, 105a, 105b, 105c, 105d: Demodulating unit
110: Operational amplifier
111: Adder
120: Electronic device
130: Capacitive touch panel
131: Resistive sheet (ITO)
132: Polarizer
140: Sampler
141: Multiplier, 141a: Multiplier I, 141b: Multiplier Q
142: Integrator, 142a: Integrator I, 142b: Integrator Q
143: Register, 143a: Register 1, 143b: Register Q
144: Multiplier, 144a: Multiplier I, 144b: Multiplier Q
145: Phase shifter
146: Controller

What is claimed is:
1. An electrostatic capacitance sensor comprising:
an excitation generator configured to generate an intermittent sinusoidal wave signal;
a sensor system configured to perform an arithmetic operation on an input and the intermittent sinusoidal wave signal, and to generate an amplitude-modulated signal having an amplitude which changes in accordance with the input and having a frequency which is equal to a frequency of the intermittent sinusoidal wave signal;
a demodulator configured to demodulate the amplitude-modulated signal by using both of: a first observed signal that is the amplitude-modulated signal generated by the sensor system in a period in which the excitation generator has output a sinusoidal wave and of a second observed signal that is the amplitude-modulated signal generated by the sensor system in a period in which there is no sinusoidal wave output from the excitation generator, the period being at least one of immediately before and immediately after the period in which the excitation generator has output the sinusoidal wave; and
a resistive sheet,
wherein the sensor system includes drive and sensing circuitry connected to the resistive sheet, the drive and sensing circuitry being configured to apply a voltage generated by the excitation generator generating the intermittent sinusoidal wave signal to the resistive sheet and measure a current flowing through the resistive sheet, capacitance of a capacitor formed by the resistive sheet and a pointing object is detected to detect a touch of the pointing object or coordinates of a touch of the pointing object, and the demodulator is further configured to perform subtraction between a first vector representing the first observed signal and a second vector representing the second observed signal and to set a magnitude of a vector obtained by the subtraction as an amplitude of a true signal in response to the input, where the first vector is a vector having, as a first component and a second component respectively, a real part and an imaginary part of a frequency component of the sinusoidal wave in first complex signals generated by Fourier transform of the first observed signal representing the true signal and a noise, and the second vector is a vector having, as a first component and a second component respectively, a real part and an imaginary part of a frequency component of the sinusoidal wave in second complex signals generated by Fourier transform of the second observed signal representing the noise.

2. The electrostatic capacitance sensor according to claim 1, further comprising a display, wherein in a non-addressing period of the display, there is a period in which the excitation generator outputs a sinusoidal wave and a period in which the excitation generator outputs no sinusoidal wave.

3. A touch panel comprising:

an excitation generator configured to generate an intermittent sinusoidal wave signal and provide the intermittent sinusoidal wave signal to the sensor system;

a sensor system configured to perform an arithmetic operation on an input and the intermittent sinusoidal wave signal, and to generate an amplitude-modulated signal having an amplitude which changes in accordance with the input and having a frequency which is equal to a frequency of the intermittent sinusoidal wave signal;

a demodulator configured to demodulate the amplitude-modulated signal by using both of: a first observed signal that is the amplitude-modulated signal generated by the sensor system in a period in which the excitation generator has output a sinusoidal wave and of a second observed signal that is the amplitude-modulated signal generated by the sensor system in a period in which there is no sinusoidal wave output from the excitation generator, the period being at least one of immediately before and immediately after the period in which the excitation generator has output the sinusoidal wave; and a resistive sheet, wherein the sensor system includes drive and sensing circuitry connected to the resistive sheet, the drive and sensing circuitry being configured to apply a voltage generated by the excitation generator generating the intermittent sinusoidal wave signal to the resistive sheet and measure a current flowing through the resistive sheet, capacitance of a capacitor formed by the resistive sheet and a pointing object is detected to detect a touch of the pointing object or coordinates of a touch of the pointing object, and the demodulator is further configured to perform subtraction between a first vector representing the first observed signal and a second vector representing the second observed signal and to set a magnitude of a vector obtained by the subtraction as an amplitude of a true signal in response to the input, where the first vector is a vector having, as a first component and a second component respectively, a real part and an imaginary part of a frequency component of the sinusoidal wave in first complex signals generated by Fourier transform of the first observed signal representing the true signal and a noise, and the second vector is a vector having, as a first component and a second component respectively, a real part and an imaginary part of a frequency component of the sinusoidal wave in second complex signals generated by Fourier transform of the second observed signal representing the noise.

4. The touch panel according to claim 3, further comprising a display, wherein in a non-addressing period of the display, there is a period in which the excitation generator outputs a sinusoidal wave and a period in which the excitation generator outputs no sinusoidal wave.

5. An electronic device comprising:

a sensor system including an operational amplifier and a resistor connected between an output terminal and an inverting input terminal of the operational amplifier;

a conductor connected to the inverting input terminal of the operational amplifier;

an excitation generator configured to generate an intermittent sinusoidal wave signal and provide the intermittent sinusoidal wave signal to a non-inverting input terminal of the operational amplifier; and a demodulator, wherein the sensor system is further configured to perform an arithmetic operation on an input and the intermittent sinusoidal wave signal, and to generate an amplitude-modulated signal having an amplitude which changes in accordance with the input and having a frequency which is equal to a frequency of the intermittent sinusoidal wave signal, the demodulator is further configured to demodulate the amplitude-modulated signal by using both of:

a first observed signal that is the amplitude-modulated signal generated by the sensor system in a period in which the excitation generator has output a sinusoidal wave; and a second observed signal that is the amplitude-modulated signal generated by the sensor system in a period in which there is no sinusoidal wave output from the excitation generator, the period being at least one of immediately before and immediately after the period in which the excitation generator has output the sinusoidal wave, capacitance of the conductor is detected, and the demodulator is further configured to perform subtraction between a first vector representing the first observed signal and a second vector representing the second observed signal and to set a magnitude of a vector obtained by the subtraction as an amplitude of a true signal in response to the input, where the first vector is a vector having, as a first component and a second component respectively, a real part and an imaginary part of a frequency component of the sinusoidal wave in first complex signals generated by Fourier transform of the first observed signal representing the true signal and a noise, and the second vector is a vector having, as a first component and a second component respectively, a real part and an imaginary part of a frequency component of the sinusoidal wave in second complex signals generated by Fourier transform of the second observed signal representing the noise.

6. A method of demodulating a signal, comprising:
generating an intermittent sinusoidal wave signal by an excitation generator;
performing an arithmetic operation on an input and the intermittent sinusoidal wave signal to generate an amplitude-modulated signal having an amplitude which changes in accordance with the input and having a frequency which is equal to a frequency of the intermittent sinusoidal wave signal; and
demodulating the amplitude-modulated signal by using both of:
  a first observed signal that is the amplitude-modulated signal generated in a period in which the excitation generator has output a sinusoidal wave; and
  a second observed signal that is the amplitude-modulated signal generated in a period in which there is no sinusoidal wave output from the excitation generator, the period being at least one of immediately before and immediately after the period in which the excitation generator has output the sinusoidal wave,
wherein the demodulating step includes performing subtraction between a first vector representing the first observed signal and a second vector representing the second observed signal by subtracting each component between the first vector and the second vector and to set a magnitude of a vector obtained by the subtraction as an amplitude of a true signal in response to the input, where the first vector is a vector having, as a first component and a second component respectively, a real part and an imaginary part of a frequency component of the sinusoidal wave in first complex signals generated by Fourier transform of the first observed signal representing the true signal and a noise, and the second vector is a vector having, as a first component and a second component respectively, a real part and an imaginary part of a frequency component of the sinusoidal wave in second complex signals generated by Fourier transform of the second observed signal representing the noise.

* * * * *

UNITED STATES PATENT AND TRADEMARK OFFICE
CERTIFICATE OF CORRECTION

PATENT NO. : 10,330,766 B2
APPLICATION NO. : 14/240675
DATED : June 25, 2019
INVENTOR(S) : Hiroshi Haga and Hideki Asada Page 1 of 1

It is certified that error appears in the above-identified patent and that said Letters Patent is hereby corrected as shown below:

On the Title Page

Item (73) Assignee:
Delete "NLT TECHNOLOGIES, LTD." and insert --TIANMA JAPAN, LTD.--

Signed and Sealed this
Third Day of September, 2019

Andrei Iancu
*Director of the United States Patent and Trademark Office*